(12) United States Patent
Jeong et al.

(10) Patent No.: US 11,910,600 B2
(45) Date of Patent: Feb. 20, 2024

(54) THREE-DIMENSIONAL NONVOLATILE MEMORY DEVICE AND A METHOD OF FABRICATING THE SAME

(71) Applicant: SAMSUNG ELECTRONICS CO., LTD., Suwon-si (KR)

(72) Inventors: Seonghun Jeong, Hwaseong-si (KR); Byoungil Lee, Hwaseong-si (KR); Bosuk Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 366 days.

(21) Appl. No.: 17/037,532

(22) Filed: Sep. 29, 2020

(65) Prior Publication Data

US 2021/0257384 A1    Aug. 19, 2021

(30) Foreign Application Priority Data

Feb. 13, 2020  (KR) .................. 10-2020-0017777

(51) Int. Cl.
| | |
|---|---|
| *H10B 43/27* | (2023.01) |
| *H01L 23/532* | (2006.01) |
| *H01L 23/528* | (2006.01) |
| *H01L 23/535* | (2006.01) |
| *H10B 41/27* | (2023.01) |
| *H10B 41/41* | (2023.01) |
| *H10B 43/40* | (2023.01) |

(52) U.S. Cl.
CPC .......... *H10B 43/27* (2023.02); *H01L 23/5283* (2013.01); *H01L 23/535* (2013.01); *H01L 23/53257* (2013.01); *H01L 23/53271* (2013.01); *H10B 41/27* (2023.02); *H10B 41/41* (2023.02); *H10B 43/40* (2023.02)

(58) Field of Classification Search
CPC ........ H01L 27/11582; H01L 27/11551–11556; H01L 27/11273–1128; H01L 27/11597; H01L 27/11575
See application file for complete search history.

(56) References Cited

U.S. PATENT DOCUMENTS

| | | | |
|---|---|---|---|
| 8,748,249 B2 | 6/2014 | Yang et al. | |
| 8,952,438 B2 | 2/2015 | Shim et al. | |
| 9,583,439 B1 | 2/2017 | Chen | |
| 9,985,048 B2 | 5/2018 | Lee | |
| 2018/0366483 A1* | 12/2018 | Choi | .................. H01L 27/1157 |
| 2019/0115356 A1 | 4/2019 | Lee | |
| 2019/0244970 A1 | 8/2019 | Jung et al. | |

* cited by examiner

*Primary Examiner* — Amar Movva
(74) *Attorney, Agent, or Firm* — Fish & Richardson P.C.

(57) ABSTRACT

A three-dimensional nonvolatile memory device includes: a substrate including a cell area and an extension area having a staircase structure; a vertical structure on the substrate; a stacking structure having electrode layers and interlayer insulating layers on the substrate; a separation insulating layer on the substrate and separating the electrode layers; and a through-via wiring area adjacent to the cell or extension area and having through-vias passing through the substrate, wherein the cell area includes a main cell area in which normal cells are arranged and an edge cell area, the separation insulating layer includes a main separation insulating layer in the main cell area and an edge separation insulating layer in the edge cell area, and a lower surface of the main separation insulating layer is higher than the upper surface of the substrate and has a different depth than a lower surface of the edge separation insulating layer.

18 Claims, 29 Drawing Sheets

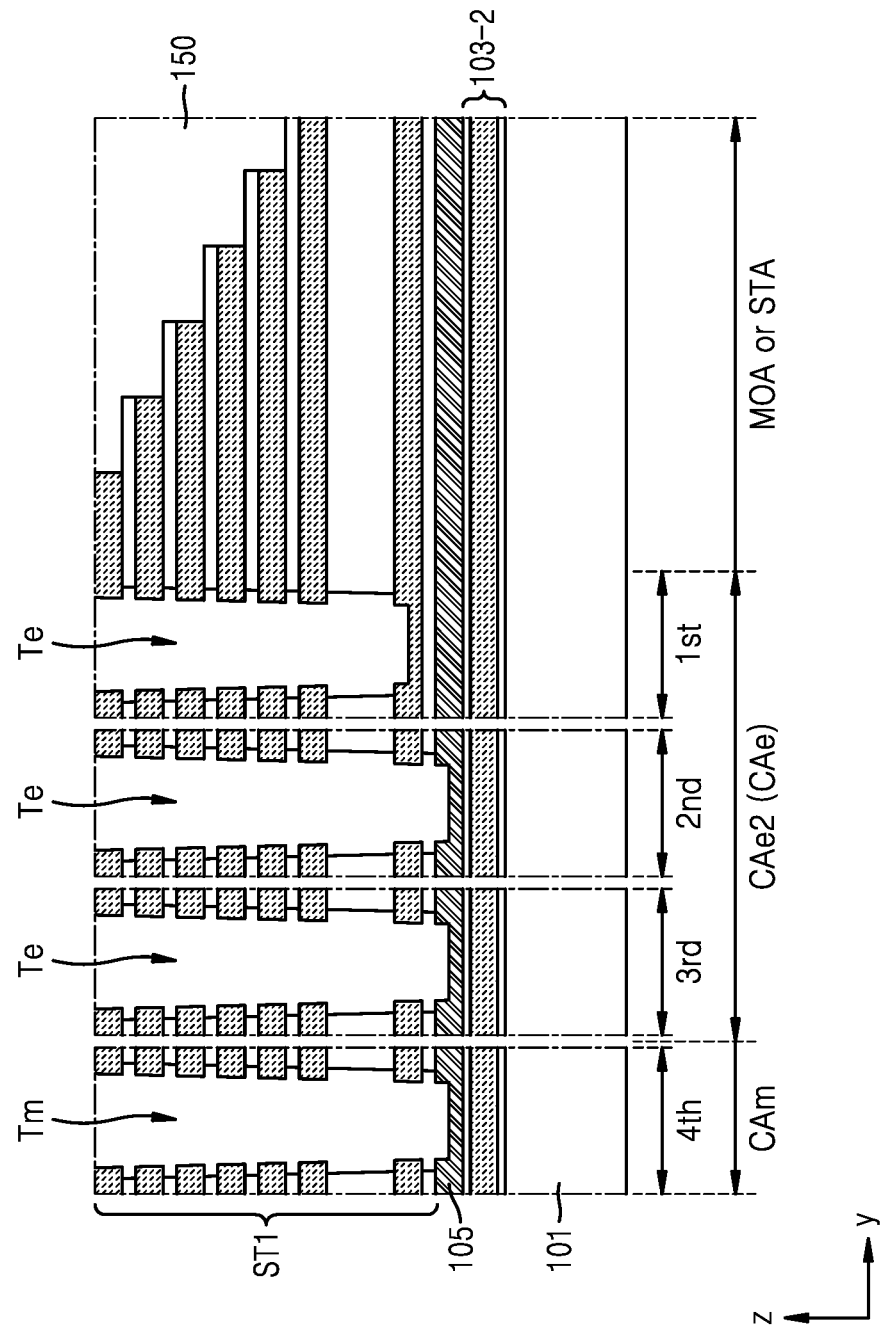

THREE-DIMENSIONAL NONVOLATILE MEMORY DEVICE AND A METHOD OF FABRICATING THE SAME

CROSS-REFERENCE TO RELATED APPLICATION

This application claims priority under 35 U.S.C. 119 to Korean Patent Application No. 10-2020-0017777, filed on Feb. 13, 2020, in the Korean Intellectual Property Office, the disclosure of which is incorporated by reference herein in its entirety.

TECHNICAL FIELD

The inventive concept relates to a nonvolatile memory device and a method of fabricating the same, and more particularly, to a nonvolatile memory device having a vertical channel structure with an increased degree of integration and a method of fabricating the same.

DISCUSSION OF RELATED ART

Recently, there has been an increase in the number of devices using a nonvolatile memory device. For example, MP3 players, digital cameras, portable phones, camcorders, flash cards, solid-state disks (SSDs), and the like may use a nonvolatile memory as a storage device. A nonvolatile memory can retrieve stored information after having been power cycled. Among nonvolatile memories, flash memory can electrically delete all data in a cell. In other words, flash memory can be electrically erased and reprogrammed. In addition, flash memory is highly portable and cost effective and as such is widely used as a storage device. Nevertheless, due to demands for an increase in storage capacity, there is a need to increase the storage space of flash memory.

SUMMARY

According to an exemplary embodiment of the inventive concept, a three-dimensional nonvolatile memory device includes: a first substrate including a cell area and an extension area arranged at a side of the cell area in a first direction, wherein the extension area has a staircase structure; a vertical structure extending in a vertical direction from an upper surface of the first substrate; a stacking structure having electrode layers and interlayer insulating layers alternately stacked on the first substrate along a side wall of the vertical structure; a separation insulating layer extending on the first substrate in the first direction and separating the electrode layers in a second direction that intersects the first direction; and a through-via wiring area adjacent to the cell area or the extension area and having through-vias passing through the first substrate, wherein the cell area includes a main cell area in which normal cells are arranged and an edge cell area at a peripheral part of the cell area, the separation insulating layer includes a main separation insulating layer in the main cell area and an edge separation insulating layer in the edge cell area, and a lower surface of the main separation insulating layer is higher than the upper surface of the first substrate and has a different depth from that of a lower surface of the edge separation insulating layer.

According to another exemplary embodiment of the inventive concept. a three-dimensional nonvolatile memory device includes: a substrate including a cell area in which cells are arranged and an extension area arranged at a side of the cell area in a first direction, wherein the extension area has a staircase structure in the first direction; a vertical structure extending in a vertical direction from an upper surface of the substrate; a stacking structure having electrode layers and interlayer insulating layers alternately stacked on the substrate along a side wall of the vertical structure; and a separation insulating layer extending on the substrate in the first direction and separating the electrode layers in a second direction that intersects the first direction, wherein the cell area includes a main cell area in which normal cells are arranged and an edge cell area at a peripheral part of the cell area, the separation insulating layer includes a main separation insulating layer in the main cell area and edge separation insulating layers in the edge cell area, and at least two of the edge separation insulating layers have different depths.

According to another exemplary embodiment of the inventive concept. a method of fabricating a three-dimensional nonvolatile memory device includes: forming at least one insulating layer and a support layer on a substrate, wherein the substrate includes a cell array area and an extension area; forming a mold structure by alternately stacking interlayer insulating layers and sacrificial layers on the support layer, forming a vertical structure extending in a vertical direction from an upper surface of the substrate and passing through the at least one insulating layer, the support layer, and the mold structure; forming a separation trench extending on the substrate in a first direction and separating the cell array area and the extension area in a second direction that intersects the first direction; forming a spacer covering a lower surface and a side wall of the separation trench; exposing at least one insulating layer by removing a lower surface of the spacer, forming a first horizontal layer in contact with a channel layer of the vertical structure by substituting the at least one insulating layer with a first conductive layer, exposing the interlayer insulating layers and the sacrificial layers to the side wall of the separation trench by removing the spacer in the separation trench; forming a stacking structure having electrode layers and the interlayer insulating layers alternately stacked along a side wall of the vertical structure by substituting the sacrificial layers with second conductive layers; and forming a separation insulating layer by filling a buried insulating layer inside the separation trench, wherein the cell area includes a main cell area in which normal cells are arranged and an edge cell area at a peripheral part of the cell area, the separation trench includes a main separation trench in the main cell area and a plurality of edge separation trenches in the edge cell area, the main separation trench exposes the at least one insulating layer, and some of the plurality of edge separation trenches expose the substrate.

According to another exemplary embodiment of the inventive concept. a three-dimensional nonvolatile memory device includes: a substrate including a first cell area and a second cell area; a first vertical structure extending in a vertical direction from an upper surface of the substrate in the first cell area; a second vertical structure extending in the vertical direction from an upper surface of the substrate in the second cell area; a stacking structure having electrode layers and interlayer insulating layers alternately stacked on the substrate along a side wall of the first and second vertical structures; a horizontal layer disposed on the upper surface of the substrate and penetrating the sidewall of first vertical structure; and a material layer disposed on the upper surface of the substrate and contacting the sidewall of the second vertical structure.

BRIEF DESCRIPTION OF THE DRAWINGS

The above and other features of the inventive concept will be more clearly understood by describing in detail exemplary embodiments thereof in conjunction with the accompanying drawings in which:

FIG. 6B is a cross-sectional view of a structure of a separation trench taken along line II-II' of FIG. 6A;

DETAILED DESCRIPTION OF THE EMBODIMENTS

Figure 1:
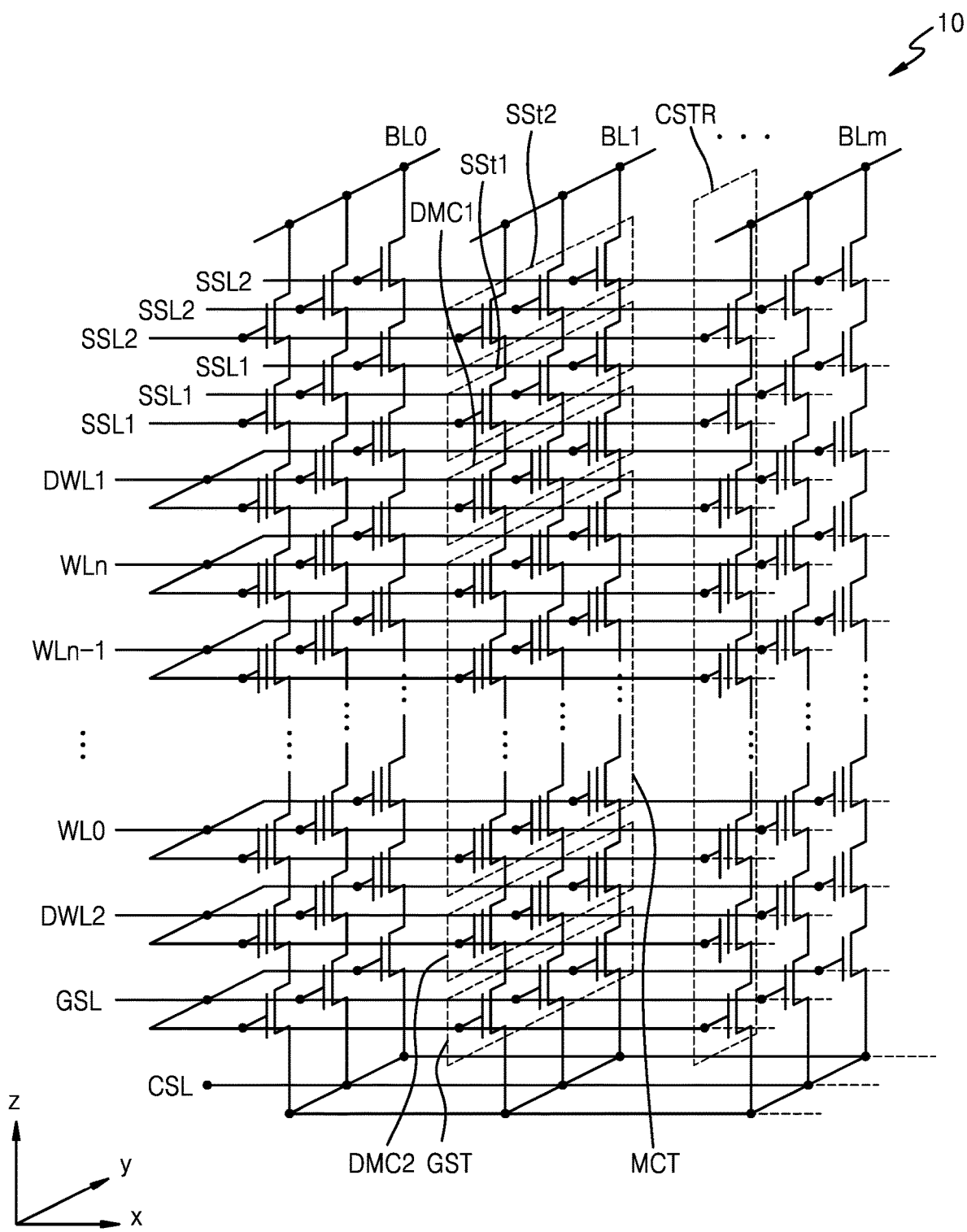
FIG. 1 is an equivalent circuit diagram of a memory cell of a three-dimensional nonvolatile memory device according to an exemplary embodiment of the inventive concept.

Hereinafter, exemplary embodiments of the inventive concept will be described in detail with reference to the accompanying drawings. Like reference numerals in the drawings may denote like elements, and thus their repetitive description may be omitted.

FIG. 1 is an equivalent circuit diagram of a memory cell of a three-dimensional nonvolatile memory device 10 according to an exemplary embodiment of the inventive concept.

Referring to FIG. 1, the three-dimensional nonvolatile memory device 10 according to the present embodiment may include a common source line CSL, a plurality of bit lines BL0 to BLm, and a plurality of cell strings CSTR. The bit lines BL0 to BLm may be two-dimensionally arranged, and the plurality of cell strings CSTR may be connected in parallel to the bit lines BL0 to BLm, respectively. For example, a plurality of cell strings CSTR may be connected the bit line BLm and another plurality of cell strings CSTR may be connected to the bit line BL0. The plurality of cell strings CSTR may be commonly connected to the common source line CSL.

Each of the cell strings CSTR may include first and second string select transistors SSt1 and SSt2, memory cell transistors MCT, and a ground select transistor GST. Each of the memory cell transistors MCT may include a data storage element. Particularly, the first and second string select transistors SSt1 and SSt2 may be connected in series to each other, the second string select transistor SSt2 may be connected to a corresponding one of the bit lines BL0 to BLm, and the ground select transistor GST may be connected to the common source line CSL. In addition, the memory cell transistors MCT may be connected in series between the first string select transistor SSt1 and the ground select transistor GST. According to an exemplary embodiment of the inventive concept, each of the cell strings CSTR may include one string select transistor. The first and second string select transistors SSt1 and SSt2 may be connected to first and second string select lines SSL1 and SSL2.

As shown in FIG. 1, each of the cell strings CSTR may include a first dummy cell transistor DMC1 connected between the first string select transistor SSt1 and a memory cell transistor MCT and a second dummy cell transistor DMC2 connected between the ground select transistor GST and the memory cell transistor MCT. For example, the first dummy cell transistor DMC1 may be connected to an uppermost memory cell transistor MCT and the second dummy cell transistor DMC2 may be connected to a lowermost memory cell transistor MCT. The first and second dummy cell transistor DMC1 and DMC2 may be connected to first and second dummy word lines DWL1 and DWL2. In addition, the ground select transistor GST may be connected to a ground select line GSL. However, according to an exemplary embodiment of the inventive concept, at least one of the first and second dummy cell transistors DMC1 and DMC2 may be omitted.

Because one cell string CSTR includes a plurality of memory cell transistors MCT having different distances from the common source line CSL, multi-layer word lines WL0 to WLn may be arranged between the common source line CSL and the bit lines BL0 to BLm. In addition, gate electrodes of memory cell transistors MCT arranged at substantially the same distance from the common source line CSL may be commonly connected to one of the word lines WL0 to WLn and be thus in an equal potential state.

The three-dimensional nonvolatile memory device 10 according to the present embodiment is configured such that a depth of a separation trench is different for each area, and thus faults such as mold lifting due to not open (NOP) may be prevented, thereby providing a three-dimensional nonvolatile memory device with increased reliability. For example, in a main cell area in which normal cells are arranged, the separation trench may be formed to expose a support layer (see 105 of FIG. 3B) or at least one insulating layer (see 103-2 of FIG. 3B) on a substrate (see 101 of FIG. 3B). In addition, in an edge cell area (see CAe1 of FIG. 3A) adjacent to a through-via wiring area (see THV-A of FIG. 3A) in which a through-via (see THV of FIG. 10) is arranged, the separation trench may be formed to expose the substrate 101. As such, by forming the separation trench at a different depth for each area, in a future process, e.g., a process of substituting a horizontal layer for the at least one insulating layer 103-2, faults such as mold lifting occurring by removing a sacrificial layer under a mold structure (see ST1 of FIG. 3B) instead of the at least one insulating layer 103-2 may be prevented, thereby providing a three-dimensional nonvolatile memory device with increased reliability.

Figure 2:
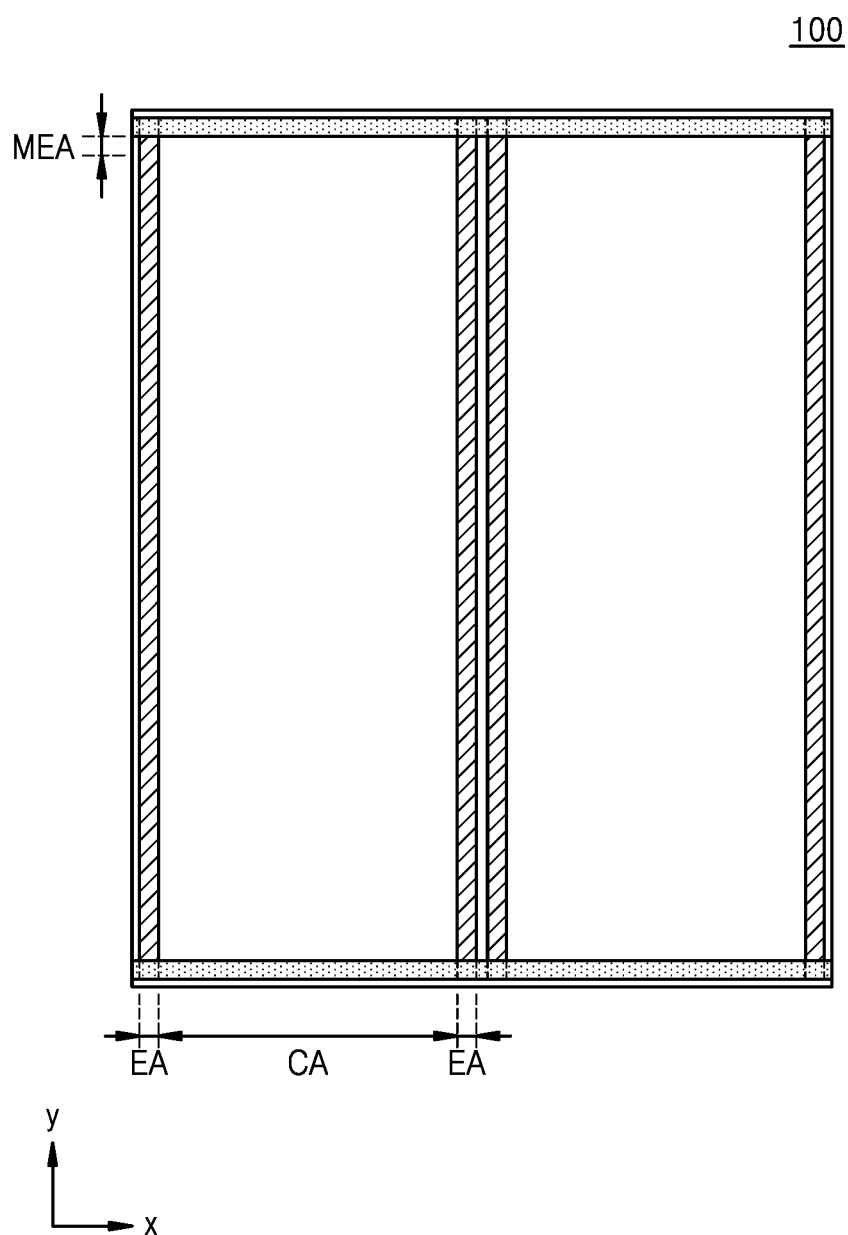
FIG. 2 is a top view of a three-dimensional nonvolatile memory device according to an exemplary embodiment of the inventive concept.

FIG. 2 is atop view of a three-dimensional nonvolatile memory device 100 according to an exemplary embodiment of the inventive concept, showing a planar structure of one chip.

Referring to FIG. 2, the three-dimensional nonvolatile memory device (hereinafter, simply referred to as 'memory device') 100 according to the present embodiment may include a cell area CA in which cells are arranged in an array structure and an extension area EA arranged at both sides of the cell area CA in a first direction (e.g., x direction).

In the cell area CA, cells may be arranged in a block unit in a second direction (e.g., y direction). In addition, in a block, at least one separation insulating layer (see DAm, DAe, and the like of FIG. 3A) extending in the first direction (x direction) and separating an electrode layer in the second direction (y direction) may be arranged. For example, in the memory device 100 of the present embodiment, about three separation insulating layers may be arranged in one block. However, the number of separation insulating layers in a block is not limited thereto.

In the cell area CA, for example, a through-via wiring area (see THV-A of FIG. 3A) having a through-via THV may be arranged between blocks in the second direction (y direction). A portion of the cell area CA adjacent to the through-via wiring area THV-A may correspond to a first edge cell area (see CAe1 of FIG. 3A).

The extension area EA is formed by extending from the cell area CA in the first direction (x direction) and may have a staircase structure having a lower height as it gets farther from the cell area CA in the first direction (x direction). Extension areas EA are arranged at both sides in the first direction (x direction) in correspondence to one block of the cell area CA, but only any one extension area EA may be used as an electrode pad of an electrode layer. In addition, a through-via wiring area THV-A may also be arranged between the extension areas EA in the second direction (y direction).

A staircase structure may be formed at both outermost parts of a chip in the second direction (y direction). When the cell area CA is a quadrangular mat, both outermost areas of a chip in the second direction (y direction) are a mat outlying area MOA or a staircase structure area STA. A staircase structure of the mat outlying area MOA may be formed together when the extension area EA is formed but may not be electrically functional. A portion of the cell area CA adjacent to the mat outlying area MOA is referred to as a mat edge area MEA and may correspond to a second edge cell area (see CAe2 of FIG. 6A) below.

As a reference, the cell area CA may include a main cell area CAm and an edge cell area CAe. The main cell area CAm is the cell area CA in which normal cells that perform a normal memory function are arranged. The main cell area CMa may be commonly located at a center part of the cell area CA. The edge cell area CAe is an area in which dummy cells are arranged or an area in which no normal cells are arranged. The edge cell area CAe may be located at an outer peripheral part of the cell area CA. For example, the edge cell area CAe may include a first edge cell area CAe adjacent to a through-via wiring area THV-A and a second edge cell area CAe2 adjacent to a mat outlying area MOA. The second edge cell area CAe2 may be referred to as a mat edge area MEA. In addition, the first edge cell area CAe1 may include not only an area adjacent to the through-via wiring area THV-A but also a part of the cell area CA corresponding to an area where channel patterns are not formed or the density of channel patterns is low. The first edge cell area CAe may be referred to as, for example, a tile-cut area.

Figure 3A:
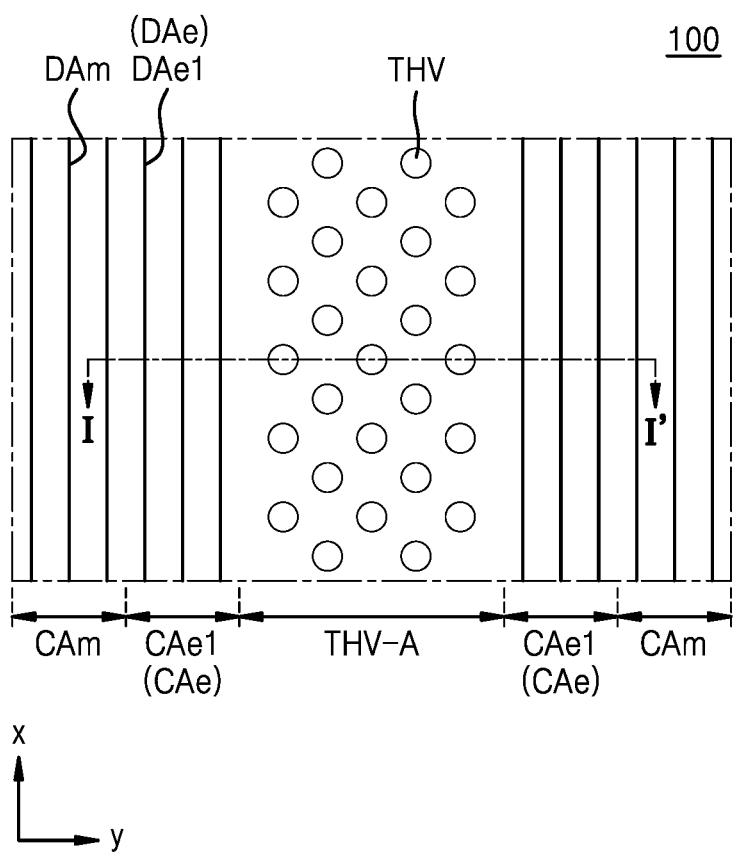
FIG. 3A is a magnified top view of a portion of a cell area of the three-dimensional nonvolatile memory device of FIG. 2.
Figure 3B:
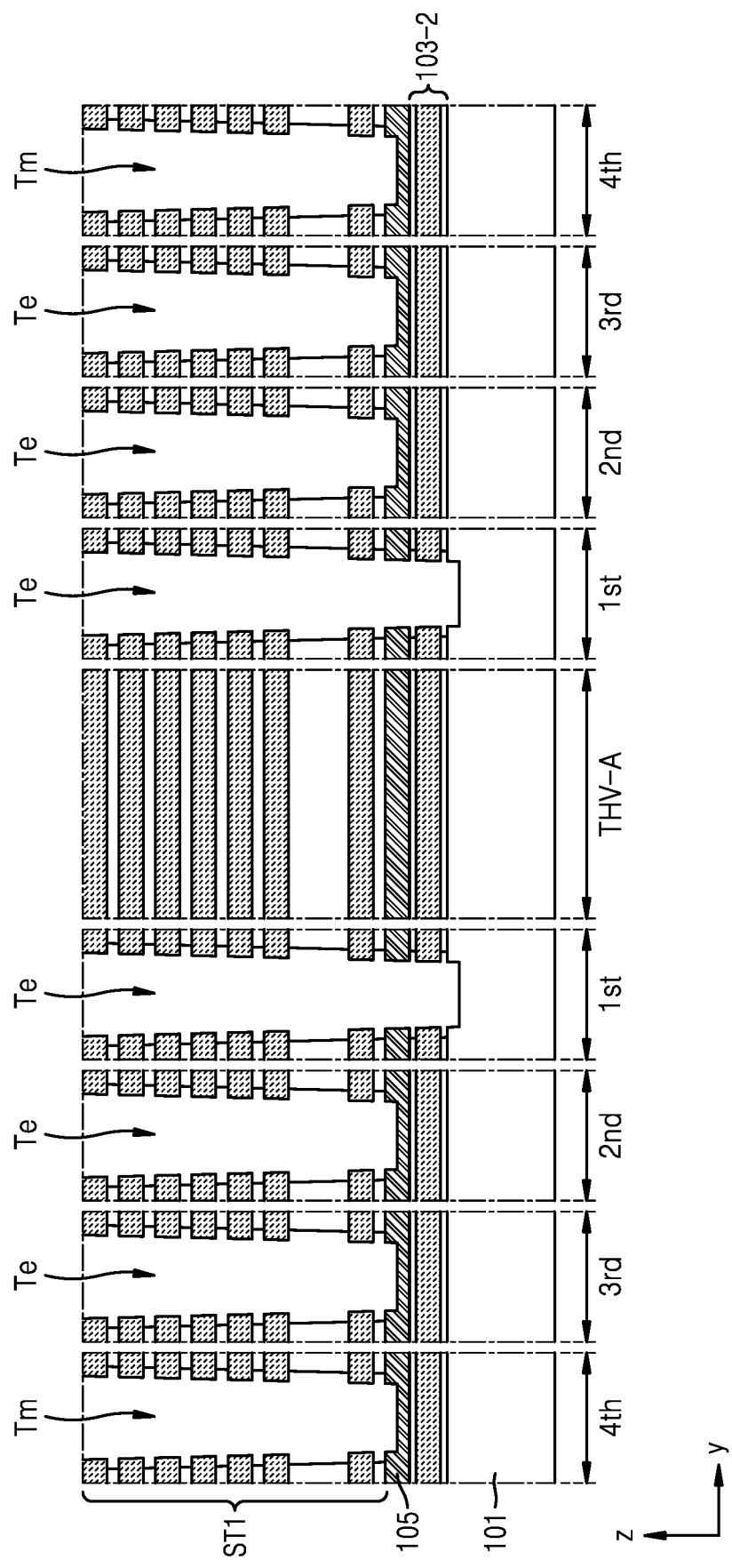
FIG. 3B is a cross-sectional view of a separation trench structure taken along line I-I' of FIG. 3A.

FIG. 3A is a magnified top view of a portion of a cell area CA of the memory device 100 of FIG. 2, and FIG. 3B is a cross-sectional view of a separation trench structure taken along line I-I' of FIG. 3A. In FIG. 3B, in a through-via wiring area THV-A, a mold structure may be maintained without forming through-vias THV yet.

Referring to FIGS. 3A and 3B, the cell area CA may include a main cell area CAm and a first edge cell area CAe1. The first edge cell area CAe1 may be adjacent to the through-via wiring area THV-A in which the through-vias THV are arranged. The main cell area CAm may be arranged far from the through-via wiring area THV-A in the second direction (y direction). For example, the first edge cell area CAe1 may be disposed between the main cell area CAm and the through-via wiring area THV-A. In addition, main separation insulating layers DAm extending in the first direction (x direction) may be arranged in the main cell area CAm, and first edge separation insulating layers DAe1 extending in the first direction (x direction) may be arranged in the first edge cell area CAe1.

Although three first edge separation insulating layers DAe1 are arranged in the first edge cell area CAe1, the number of first edge separation insulating layers DAe1 is not limited to three. For example, two or less first edge separation insulating layers DAe1 or four or more first edge separation insulating layers DAe1 may be arranged in the first edge cell area CAe1. In FIG. 3A, although the through-via wiring area THV-A, the main cell area CAm, and the first edge cell area CAe are distinguished from each other based on locations apart from the main and first separation insulating layers DAm and DAe, identification of the areas is not limited thereto. For example, the through-via wiring area THV-A, the main cell area CAm, and the first edge cell area CAe1 may be distinguished from each other based on certain ones of the main and first separation insulating layers DAm and DAe1.

In the memory device 100 of the present embodiment, as shown in FIG. 3B, a structure of a trench for the main separation insulating layer DAm may differ from a structure of a trench for the first edge separation insulating layer DAe1. For example, in FIG. 3B, when first to third trenches Te from the through-via wiring area THV-A are trenches for the first edge separation insulating layers DAe, and a fourth trench Tm is a trench for the main separation insulating layer DAm, a depth of the first trench Te may be greater than a depth of the fourth trench Tm. In addition, the depth of the first trench Te may be greater than a depth of the second and third trenches. Particularly, the fourth trench Tm may be formed in a shape in which a bottom surface of the fourth trench Tm is recessed on an upper surface of a support layer 105 by passing through a mold structure ST1. However, the first trench Te may be formed in a shape in which a bottom surface of the first trench Te is recessed on an upper surface of a substrate 101 by passing through the mold structure ST1, the support layer 105, and at least one insulating layer 103-2. The mold structure ST1 may have a structure in which a sacrificial layer (SL of FIG. 11A) and an interlayer insulating layer (see ILD of FIG. 11A) are alternately stacked.

In FIG. 3B, although the fourth trench Tm is formed in a shape of extending to an upper surface part of the support layer 105, according to an exemplary embodiment of the inventive concept, the fourth trench Tm may be formed in a shape of extending to an upper surface part of the at least one insulating layer 103-2 by totally passing through the support layer 105. In the alternative, the fourth trench Tm may extend to an upper surface part of the at least one insulating layer 103-2. In addition, the second and third trenches Te for the first edge separation insulating layers DAe1 may be formed at a depth similar to that of the fourth trench Tm for the main separation insulating layer DAm. However, according to an exemplary embodiment of the inventive concept, the second and third trenches Te may be formed at a depth substantially the same as that of the first trench Te or at a depth between those of the fourth trench Tm and the first trench Te.

A method of forming a trench at a large depth in the first edge cell area CAe1 may be implemented through various methods. For example, a trench in the first edge cell area CAe1 may be formed at a large depth in an etching process by enlarging a critical dimension (CD) of a mask for trench etching in the first edge cell area CAe1. Alternatively, a trench in the first edge cell area CAe1 may be formed at a large depth in an etching process by not forming channel patterns or by lessening the density of channel patterns in the first edge cell area CAe1. It is to be understood, however, that methods of forming a trench at a large depth are not limited to the methods described above.

As a reference, a vertical structure (see VCS of FIG. 4) is not formed or is formed with a small density in the first edge cell area CAe1 adjacent to the through-via wiring area THV-A. Accordingly, in the first edge cell area CAe1, a trench may be formed at a larger depth than a trench in the main cell area CAm according to influences such as mold stress and/or etch loading. In other words, when an etching process using masks of the same CD is performed, a trench may be formed at a larger depth in the first edge cell area CAe1 than in the main cell area CAm.

According to an exemplary embodiment of the inventive concept, a trench in an edge cell area CAe may be formed at a depth substantially the same as a depth of a trench in the main cell area CAm. Furthermore, according to an exemplary embodiment of the inventive concept, a trench in the edge cell area CAe may be formed at a less depth than that of a trench in the main cell area CAm. Forming a trench at a less depth will be described in more detail with reference to FIGS. 6A to 7.

Figure 4:
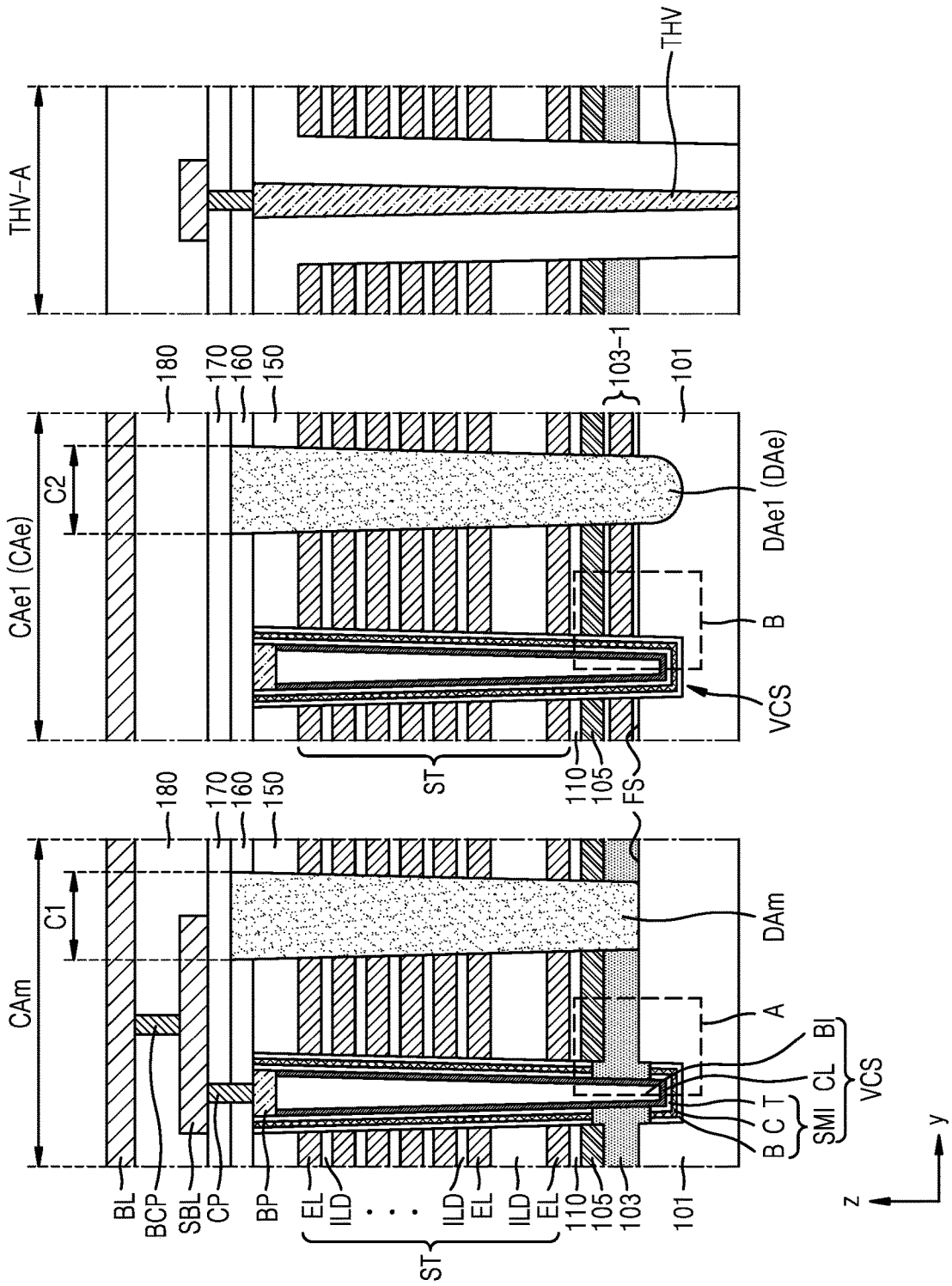
FIG. 4 is a cross-sectional view of a three-dimensional nonvolatile memory device corresponding to the cell area of FIG. 3A.
Figure 5A:
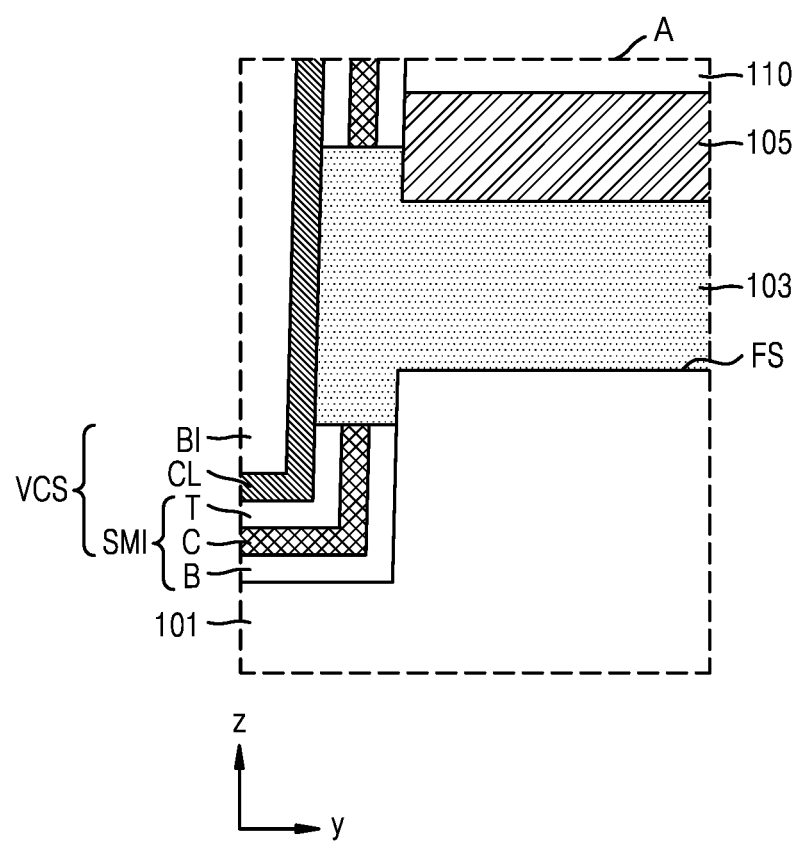
FIGS. 5A and 5B are magnified cross-sectional views of regions A and B in the three-dimensional nonvolatile memory device of FIG. 4, respectively.
Figure 5B:
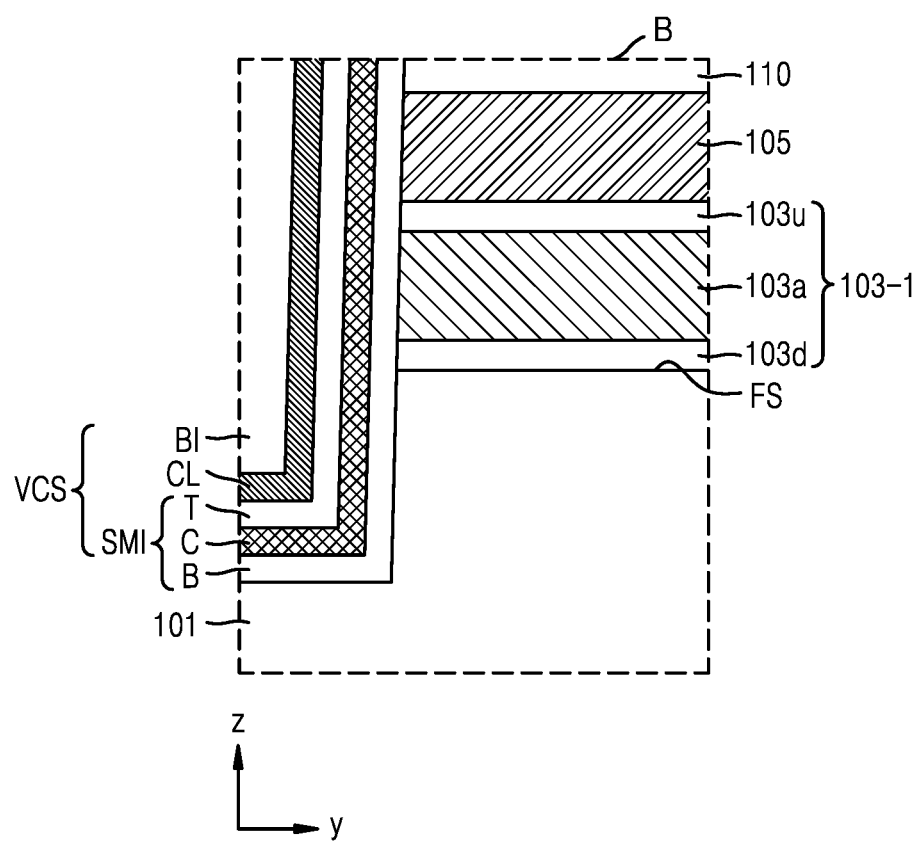

FIG. 4 is a cross-sectional view of a three-dimensional nonvolatile memory device 100 corresponding to the cell area CA of FIG. 3A, wherein a left part corresponds to the main cell area CAm, a middle part corresponds to the first edge cell area CAe1, and a right part corresponds to the through-via wiring area THV-A. FIGS. 5A and 5B are magnified cross-sectional views of regions A and B in the memory device 100 of FIG. 4, respectively.

Referring to FIGS. 4 and 5A, the memory device 100 of the present embodiment may include a vertical structure VCS and a stacking structure ST on the substrate 101 in the main cell area CAm. The substrate 101 may have an upper surface FS extending in the first direction (x direction) and the second direction (y direction). The substrate 101 may include a semiconductor material, e.g., a group IV semiconductor, a group II-V compound semiconductor, or a group II-VI oxide semiconductor. In the memory device 100 of the present embodiment, the substrate 101 may be formed of, for example, polysilicon. However, a material of the substrate 101 is not limited thereto. For example, the substrate 101 may be formed based on a monocrystalline silicon wafer.

A first horizontal layer 103 extending in parallel to the upper surface FS of the substrate 101 may be formed on the substrate 101. The first horizontal layer 103 may be formed by substituting a conductive layer for the at least one insulating layer 103-2 formed on the substrate 101. For example, the first horizontal layer 103 may be formed of polysilicon. However, a material of the first horizontal layer 103 is not limited thereto. The first horizontal layer 103 may have a structure in contact with a channel layer CL of the vertical structure VCS. For example, the channel layer CL may contact an end of the first horizontal layer 103. In other words, the first horizontal layer 103 may be in contact with the channel layer CL by passing through a side wall multi-insulating layer SMI of the vertical structure VCS. The first horizontal layer 103 may form a common source line (see CSL of FIG. 1).

A portion of the first horizontal layer 103 in contact with the channel layer CL may have a thickness greater than that of a portion of the first horizontal layer 103 extending between the support layer 105 and the substrate 101. In other words, a first portion of the first horizontal layer 103 may be thicker than a second portion of the first horizontal layer 103. For example, as shown in FIG. 5A, an upper surface of the portion of the first horizontal layer 103 in contact with the channel layer CL may be higher than a lower surface of the support layer 105, and a lower surface of the portion of the first horizontal layer 103 in contact with the channel layer CL may be lower than the upper surface FS of the substrate 101.

The support layer 105 may be on the first horizontal layer 103. The support layer 105 may also extend in parallel to the upper surface FS of the substrate 101. The support layer 105 may be formed of, for example, polysilicon. However, a material of the support layer 105 is not limited thereto.

The stacking structure ST may be on the support layer 105. The stacking structure ST may extend to the extension area EA in the first direction (x direction) in the cell area CA on the substrate 101. A buffer insulating layer 110 may be between the stacking structure ST and the support layer 105. A plurality of stacking structures ST may be on the substrate 101 and apart from each other in the second direction (y direction). For example, the main separation insulating layers DAm extending in the first direction (x direction) may be arranged in the second direction (y direction), and the stacking structures ST may be apart from each other by the main separation insulating layers DAm. Herein, the main separation insulating layer Dam, which is called a word line cut area, may be formed by filling an insulating layer in a trench, and the lower surface of the main separation insulating layer Dam may contact the upper surface FS of the substrate 101. In addition, as shown in FIG. 3A, the stacking structures ST may also be apart from each other by the through-via wiring area THV-A. A through-via THV penetrating the substrate 101, the first horizontal layer 103, the support layer 105, the stacking structure ST, and a flat insulating layer 150 may be disposed in the through-via wiring region THV-A.

The stacking structure ST may include electrode layers EL and interlayer insulating layers ILD alternately stacked in a third direction (z direction) orthogonal to the upper surface FS of the substrate 101. Thicknesses of the electrode layers EL may be substantially the same as each other. Thicknesses of the interlayer insulating layers ILD may vary according to characteristics of memory devices. In addition, the thickness of the interlayer insulating layer ILD may be less than the thickness of the electrode layer EL. Each of the electrode layers EL may form an electrode pad in the extension area EA. In the memory device 100 of the present embodiment, the electrode layer EL may be formed of tungsten (W), and the interlayer insulating layer ILD may be formed of an oxide film, e.g., a silicon oxide film. However, materials of the electrode layer EL and the interlayer insulating layer ILD are not limited thereto.

A flat insulating layer 150 may cover the stacking structure ST. The flat insulating layer 150 may have a substantially flat upper surface. The flat insulating layer 150 may cover the stacking structure ST or the electrode pad of a staircase structure. The flat insulating layer 150 may include one or more insulating layers. The flat insulating layer 150 may be formed on an oxide film, e.g., a silicon oxide film. However, a material of the flat insulating layer 150 is not limited thereto.

Figure 9A:
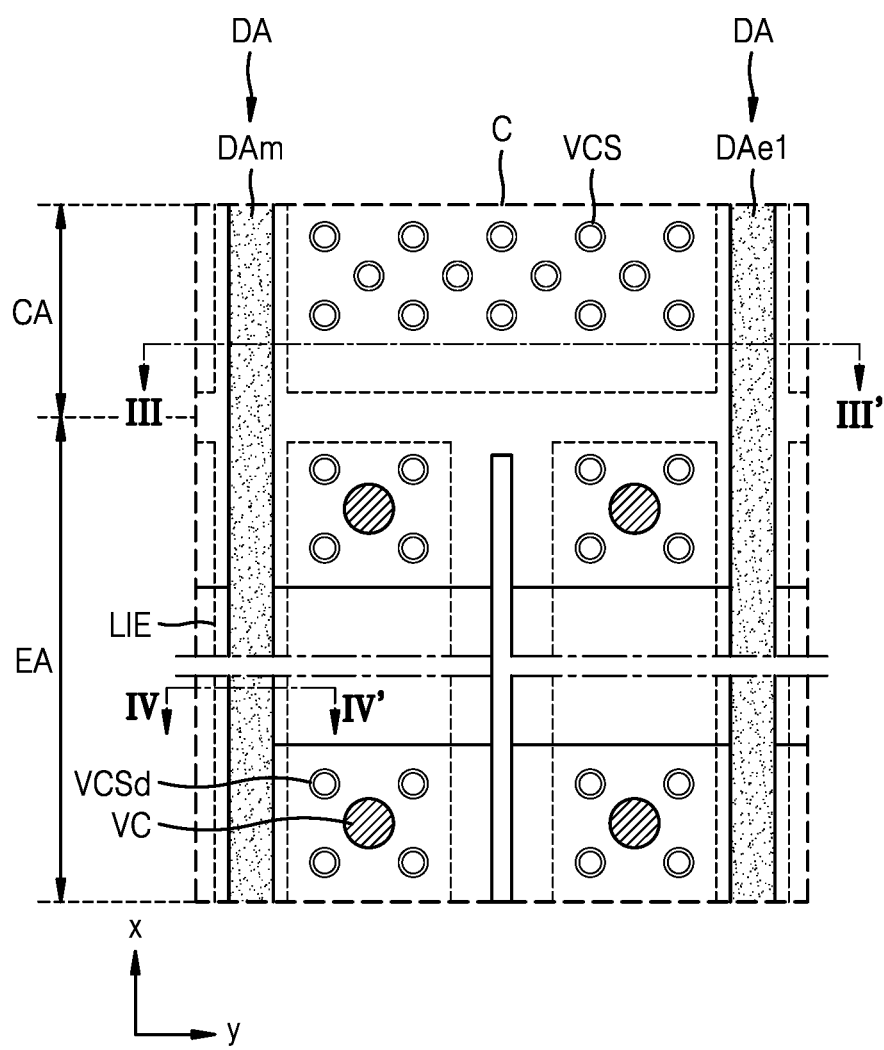
FIG. 9A is a magnified top view of region C of FIG. 8.

The vertical structure VCS may be formed on the substrate 101 and have a structure that passes through the stacking structure ST, the support layer 105, and the first horizontal layer 103. As shown in FIG. 9A, vertical structures VCS may be arranged in a zigzag shape in the first direction (x direction) in a top view. The vertical structures VCS may be arranged in the cell area CA. However, an arrangement location of the vertical structures VCS is not limited to the cell area CA. For example, vertical structures VCS may also be arranged in the extension area EA to support a mold structure in a substitution process. The vertical structures (see VCSd of FIG. 9A) in the extension area EA are also called dummy structures.

The vertical structure VCS may include the side wall multi-insulating layer SMI, the channel layer CL, and a buried insulating layer BI. The side wall multi-insulating layer SMI is a data storage film and may include a tunnel insulating layer T, a charge storage film C, and a blocking insulating layer B. The side wall multi-insulating layer SMI may be between the stacking structure ST and the channel layer CL. The side wall multi-insulating layer SMI may extend on the substrate 101 in the third direction (z direction) and encompass a side wall of the channel layer CL.

The vertical structure VCS may be separated by the first horizontal layer 103. More particularly, the first horizontal layer 103 may penetrate the side wall multi-insulating layer SMI such that a first portion of the side wall multi-insulating layer SMI is disposed between the first horizontal layer 103 and the substrate 101 and a second portion of the side wall multi-insulating layer SMI is between the first horizontal layer 103 and a first upper insulating layer 160.

The channel layer CL may have a cylinder or macaroni structure with a closed lower surface. In other words, the channel layer CL may include a bottom surface and a pair of side walls vertically extending from the bottom surface. The inside of the channel layer CL may be filled with the buried insulating layer BI. As described above, the first horizontal layer 103 may be in contact with a lower side wall of the channel layer CL. For example, the first horizontal layer 103 may contact the lower side wall of the channel layer CL below the upper surface FS of the substrate 101.

A bit line electrode pad BP and a contact plug CP connected to the bit line electrode pad BP may be on the channel layer CL. A side surface of the bit line electrode pad BP may be encompassed by the side wall multi-insulating layer SMI. According to an exemplary embodiment of the inventive concept, the bit line electrode pad BP may be located on an upper surface of the channel layer CL and an upper surface of the side wall multi-insulating layer SMI, and the side surface of the bit line electrode pad BP may be encompassed by a first upper interlayer insulating layer 160.

Figure 10:
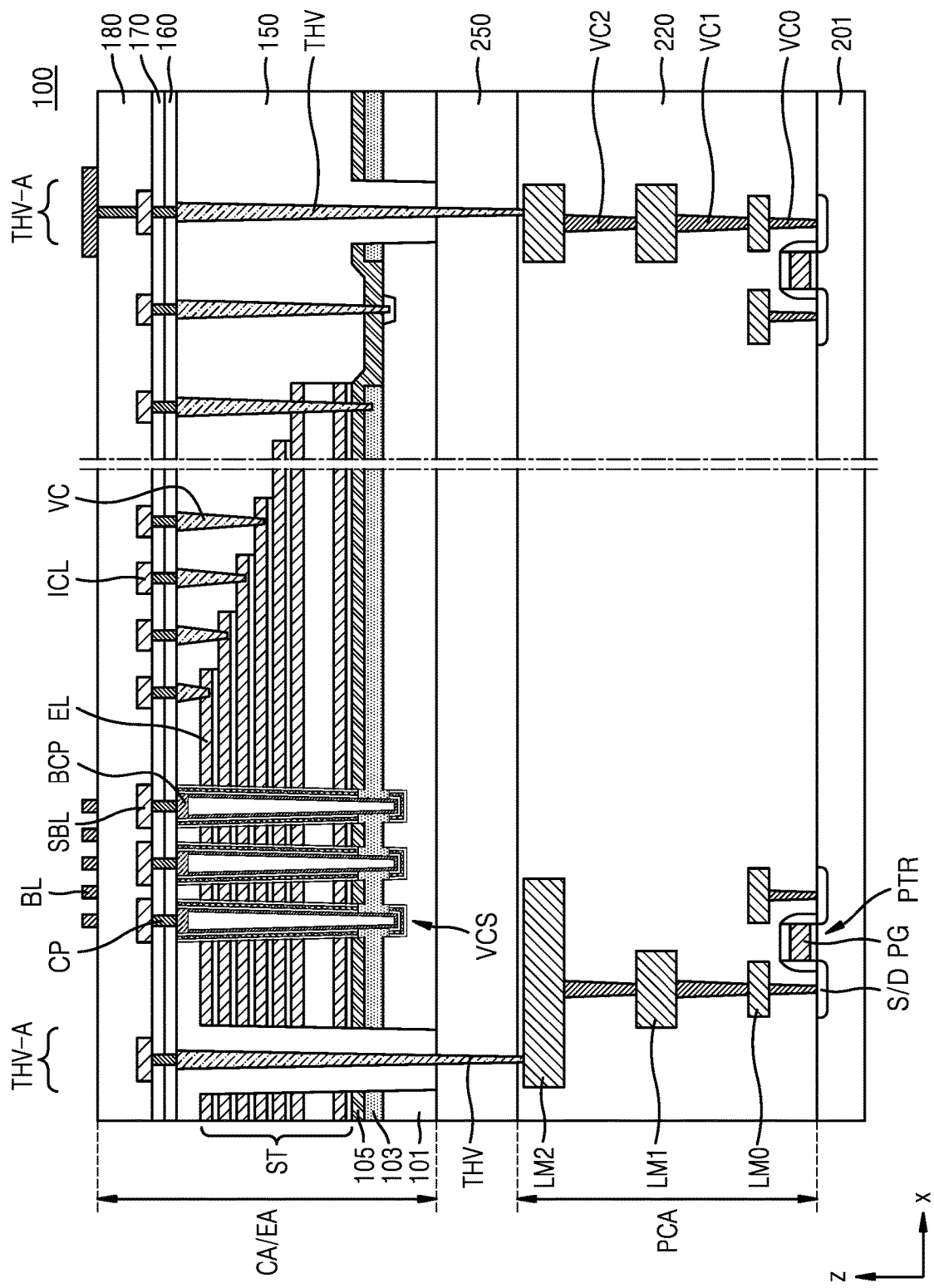
FIG. 10 is a cross-sectional view of a three-dimensional nonvolatile memory device according to an exemplary embodiment of the inventive concept.

The first upper interlayer insulating layer 160 may cover an upper surface of the vertical structure VCS and an upper surface of the flat insulating layer 150. In addition, the first upper interlayer insulating layer 160 may cover the flat insulating layer 150 in the extension area EA. A second upper interlayer insulating layer 170 may be on the first upper interlayer insulating layer 160 and cover an upper surface of the main separation insulating layers DAm. In the extension area EA, a vertical contact (see VC of FIG. 9A) may be connected to a corresponding electrode layer EL or electrode pad by passing through the first and second upper interlayer insulating layer 160 and 170. As shown in FIG. 10, a vertical length, e.g., a length in the third direction (z direction), of the vertical contact VC may be shortened as it gets closer to the cell area CA. In addition, upper surfaces of vertical contacts VC may form substantially the same plane.

A sub-bit line SBL may be on the second upper interlayer insulating layer 170 in the cell area CA and be electrically connected to a corresponding vertical structure VCS through the contact plug CP. In the extension area EA, an interconnection line (ICL of FIG. 10) may be on the second upper interlayer insulating layer 170 and be connected to the vertical contact VC. A third upper interlayer insulating layer 180 may be on the second upper interlayer insulating layer 170 and cover the sub-bit line SBL and the interconnection line ICL. A bit line BL may be on the third upper interlayer insulating layer 180 and extend in the second direction (y direction) by intersecting with the stacking structure ST. The bit line BL may be connected to the sub-bit line SBL through a bit line contact plug BCP.

Referring to FIGS. 4 and 5B, the memory device 100 of the present embodiment may also include a vertical structure VCS and a stacking structure ST on the substrate 101 in the first edge cell area CAe1. However, the first edge cell area CAe1 may differ from the main cell area CAm with respect to at least one material layer 103-1, a contact structure of the vertical structure VCS and the at least one material layer 103-1, and a structure of the first edge separation insulating layer DAe1. More particularly, the at least one material layer 103-1 may include a second horizontal layer 103a and thin-film insulating layers 103u and 103d respectively on upper and lower surfaces of the second horizontal layer 103a. The second horizontal layer 103a may be formed of for example, W, and the thin-film insulating layers 103u and 103d may be formed of an oxide film, for example, a silicon oxide film. However, materials of the second horizontal layer 103a and the thin-film insulating layers 103u and 103d are not limited thereto.

The at least one material layer 103-1 may be in contact with a side wall of a side wall multi-insulating layer SMI of the vertical structure VCS. Accordingly, the second horizontal layer 103a of the at least one material layer 103-1 may not be electrically connected to a channel layer CL of the vertical structure VCS. In addition, since the at least one material layer 103-1 does not pass through the side wall multi-insulating layer SMI, the at least one material layer 103-1 may have a uniform thickness between the support layer 105 and the substrate 101.

In the first edge cell area CAe1, the first edge separation insulating layer DAe1 may have a structure of being inserted into an upper portion of the substrate 101 by passing through the stacking structure ST, the support layer 105, and the at least one material layer 103-1. In addition, a cross-sectional shape of a lower surface of the first edge separation insulating layer DAe1 may have a semi-circular shape recessed downward from the upper surface FS of the substrate 101 as shown in FIG. 4. However, the cross-sectional shape of the lower surface of the first edge separation insulating layer DAe1 is not limited to the recessed semi-circular shape.

For example, according to an exemplary embodiment of the inventive concept, the cross-sectional shape of the lower surface of the first edge separation insulating layer DAe1 may have a recessed trapezoidal or quadrangular shape. Since the first edge separation insulating layer DAe1 passes through the at least one material layer 103-1, the at least one material layer 103-1 may be in contact with a side wall of the first edge separation insulating layer DAe1.

In the memory device 100 of the present embodiment, a first width or CD C1 of the main separation insulating layer DAm in the second direction (y direction) may be less than a second width or CD C2 of the first edge separation insulating layer DAe1 in the second direction (y direction). However, according to an exemplary embodiment of the inventive concept, the first width C1 of the main separation insulating layer DAm may be substantially the same as the second width C2 of the first edge separation insulating layer DAe1.

Figure 6A:
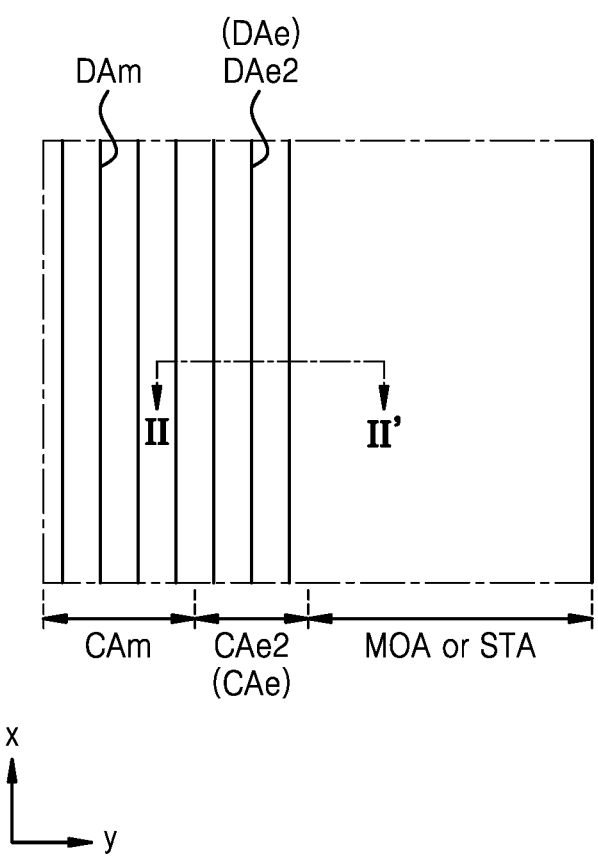
FIG. 6A is a magnified top view of a portion of the cell area of the three-dimensional nonvolatile memory device of FIG. 2.

FIG. 6A is a magnified top view of a portion of the cell area CA of the memory device 100 of FIG. 2, and FIG. 6B is a cross-sectional view of a structure of a separation trench taken along line II-II' of FIG. 6A.

Referring to FIGS. 6A and 6B, the cell area CA may include a main cell area CAm and a second edge cell area CAe2. As shown in FIG. 6A, the second edge cell area CAe2 may be adjacent to a mat outlying area MOA or a staircase structure area STA. As described above, the mat outlying area MOA may be an area having a staircase structure at both outermost areas of a chip in the second direction (y direction). The main cell area CAm may be far from the mat outlying area MOA in the second direction (y direction). In addition, main separation insulating layers DAm extending in the first direction (x direction) may be arranged in the main cell area CAm, and second edge separation insulating layers DAe2 extending in the first direction (x direction) may be arranged in the second edge cell area CAe2.

Although three second edge separation insulating layers DAe2 are arranged in the second edge cell area CAe2, the number of second edge separation insulating layers DAe2 is not limited to three. For example, two or less second edge separation insulating layers DAe2 or four or more second edge separation insulating layers DAe2 may be arranged in the second edge cell area CAe2. In addition, in FIG. 6A, although the mat outlying area MOA is distinguished from the second edge cell area CAe2 based on locations apart from the second edge separation insulating layers DAe2, the differentiation of the mat outlying area MOA from the second edge cell area CAe2 is not limited thereto. For example, the mat outlying area MOA may be distinguished from the second edge cell area CAe2 based on a first-appearing second edge separation insulating layer DAe2.

In the memory device 100 of the present embodiment, as shown in FIG. 6B, a structure of a trench for the main separation insulating layer DAm may differ from a structure of a trench for the second edge separation insulating layer DAe2. For example, in FIG. 6B, when first to third trenches Te from the mat outlying area MOA are trenches for the second edge separation insulating layers DAe2, and a fourth trench Tm is a trench for the main separation insulating layer DAm, a depth of the first trench Te may be less than a depth of the fourth trench Tm. Particularly, the fourth trench Tm may be formed in a shape in which a bottom surface of the fourth trench Tm is recessed on the upper surface of the support layer 105 by passing through the mold structure ST1. However, the first trench Te may be formed in a shape in which a bottom surface of the first trench Te is recessed on an upper surface of a sacrificial layer (see SL of FIG. 11A) at a lower side of the mold structure ST without completely passing through the mold structure ST1.

As a reference, in the mat outlying area MOA, the flat insulating layer 150 such as an oxide film covers an upper part of a staircase structure. However, in the second edge cell area CAe2, the mold structure ST1 of a non-staircase shape may be arranged. Accordingly, in the second edge cell area CAe2 adjacent to the mat outlying area MOA, a trench may be formed at a less depth than a trench in the main cell area CAm according to influences such as mold stress and/or etch loading.

As shown in FIG. 6B, the second and third trenches Te for the second edge separation insulating layers DAe2 may be formed at a depth similar to that of the fourth trench Tm for the main separation insulating layer DAm. However, according to an exemplary embodiment of the inventive concept, the second and third trenches Te may be formed at a depth substantially the same as that of the first trench Te or at a depth between those of the first trench Te and the fourth trench Tm. Alternatively, according to an exemplary embodiment of the inventive concept, the trenches in the second edge cell area CAe2 may be formed at substantially the same depth as the trench in the main cell area CAm. Furthermore, according to an exemplary embodiment of the inventive concept, the trenches in the second edge cell area CAe2 may be formed at a larger depth than the trench in the main cell area CAm. For example, the trenches in the second edge cell area CAe2 may be formed up to a depth where the substrate 101 is exposed like the trenches for the first edge separation insulating layers DAe1. This may be done to prevent faults such as mold lifting.

Figure 7A:
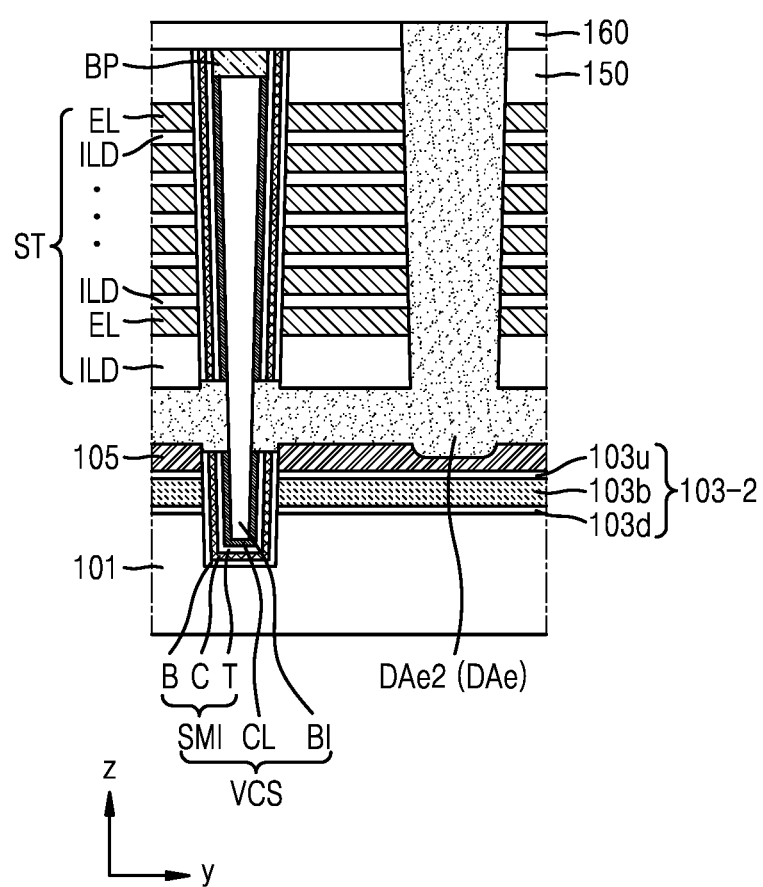
FIGS. 7A and 7B are cross-sectional views of a three-dimensional nonvolatile memory device corresponding to the cell area of FIG. 6A.
Figure 7B:
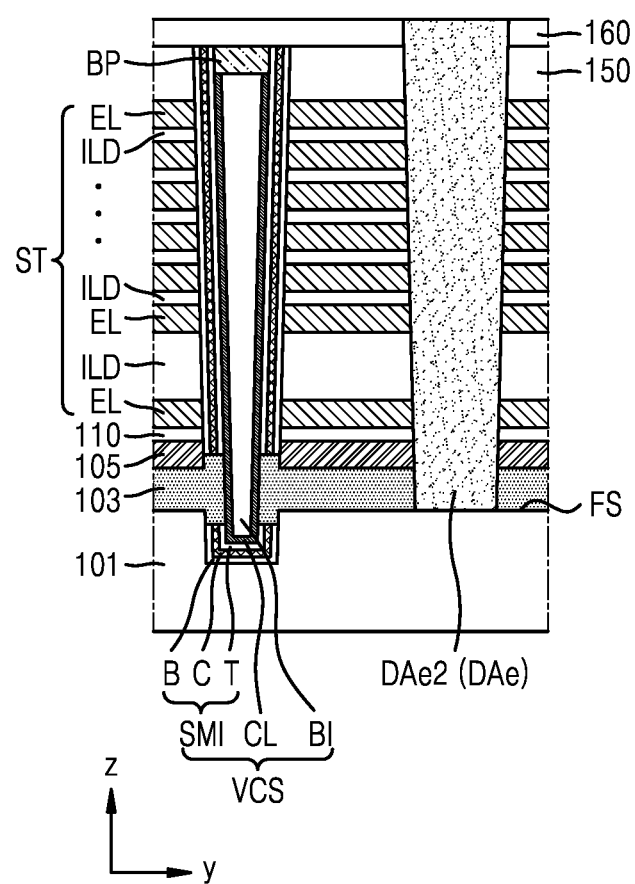

FIGS. 7A and 7B are cross-sectional views of the memory device 100 corresponding to the cell area CA of FIG. 6A, wherein portions above the first upper interlayer insulating layer 160 are omitted in the drawings for convenience. FIGS. 7A and 7B will be described with reference to FIG. 4 together, and the description made with reference to FIG. 4 will be simply repeated or omitted.

Referring to FIG. 7A, the memory device 100 of the present embodiment may also include a vertical structure VCS and a stacking layer ST on the substrate 101 in the second edge cell area CAe2. However, with respect to the at least one insulating layer 103-2, a contact structure of the vertical structure VCS and the at least one insulating layer 103-2, and a structure of the second edge separation insulating layers DAe2, the second edge cell area CAe2 may differ from the main cell area CAm. More particularly, the at least one insulating layer 103-2 may include a horizontal insulating layer 103b and thin-film insulating layers 103u and 103d respectively on upper and lower surfaces of the horizontal insulating layer 103b. The horizontal insulating layer 103b may be formed of a nitride film, e.g., a silicon nitride film, and the thin-film insulating layers 103u and 103d may be formed of an oxide film, e.g., a silicon oxide film. However, materials of the horizontal insulating layer 103b and the thin-film insulating layers 103u and 103d are not limited thereto.

The at least one insulating layer 103-2 may be in contact with a side wall of the side wall multi-insulating layer SMI of the vertical structure VCS. In addition, since the at least one insulating layer 103-2 does not pass through the side wall multi-insulating layer SMI, the at least one insulating layer 103-2 may have a uniform thickness between the support layer 105 and the substrate 101. For example, in FIG. 7A, the at least one insulating layer 103-2 has a uniform thickness, but in FIG. 7B the first horizontal layer 103 has a varying thickness where it penetrates the side wall multi-insulating layer SMI.

When a trench for separation is formed in the second edge cell area CAe2, by removing a sacrificial layer SL and an interlayer insulating layer ILD in a mold structure (see ST1 of FIG. 11A) in a future horizontal layer substitution process without passing through the support layer 105, a final second edge separation insulating layer DAe2 may have a structure in which the second edge separation insulating layer DAe2 is filled vertically between the stacking layer ST and horizontally between the interlayer insulating layer ILD and the support layer 105. As a result, the second edge separation insulating layer DAe2 may be in contact with the channel layer CL or the buried insulating layer BI of the vertical structure VCS.

According to an exemplary embodiment of the inventive concept, in the second edge cell area CAe2, the second edge separation insulating layer DAe2 may have a void at an insulating layer part extending toward the vertical structure VCS. Alternatively, according to an exemplary embodiment of the inventive concept, when a trench for separation exposes only the interlayer insulating layer ILD and does not expose the sacrificial layer SL, by slightly removing only a part of the sacrificial layer SL and the interlayer insulating layer ILD at a part adjacent to the trench in a horizontal layer substitution process, the second edge separation insulating layer DAe2 may have a structure not in contact with the vertical structure VCS. Furthermore, when a trench for separation does not pass through the support layer 105, the second edge separation insulating layer DAe2 may have various structures besides the structures described above according to process variations in a future process such as a horizontal layer substitution process.

Referring to FIG. 7B, the memory device 100 of the present embodiment may also include a vertical structure VCS and a stacking layer ST on the substrate 101 in the second edge cell area CAe2. The first horizontal layer 103, a contact structure of the vertical structure VCS and the first horizontal layer 103, and a structure of the second edge separation insulating layer DAe2 may be substantially the same as those in the main cell area CAm. In other words, like in the main cell area CAm, a trench for separation may be formed up to the substrate 101 in the second edge cell area CAe2, and in this case, a future horizontal substitution process may be performed in substantially the same way as in the main cell area CAm. Therefore, the first horizontal layer 103, a contact structure of the vertical structure VCS and the first horizontal layer 103, and a structure of the second edge separation insulating layer DAe2 substantially the same as those in the main cell area CAm may be formed in the second edge cell area CAe2.

Figure 8:
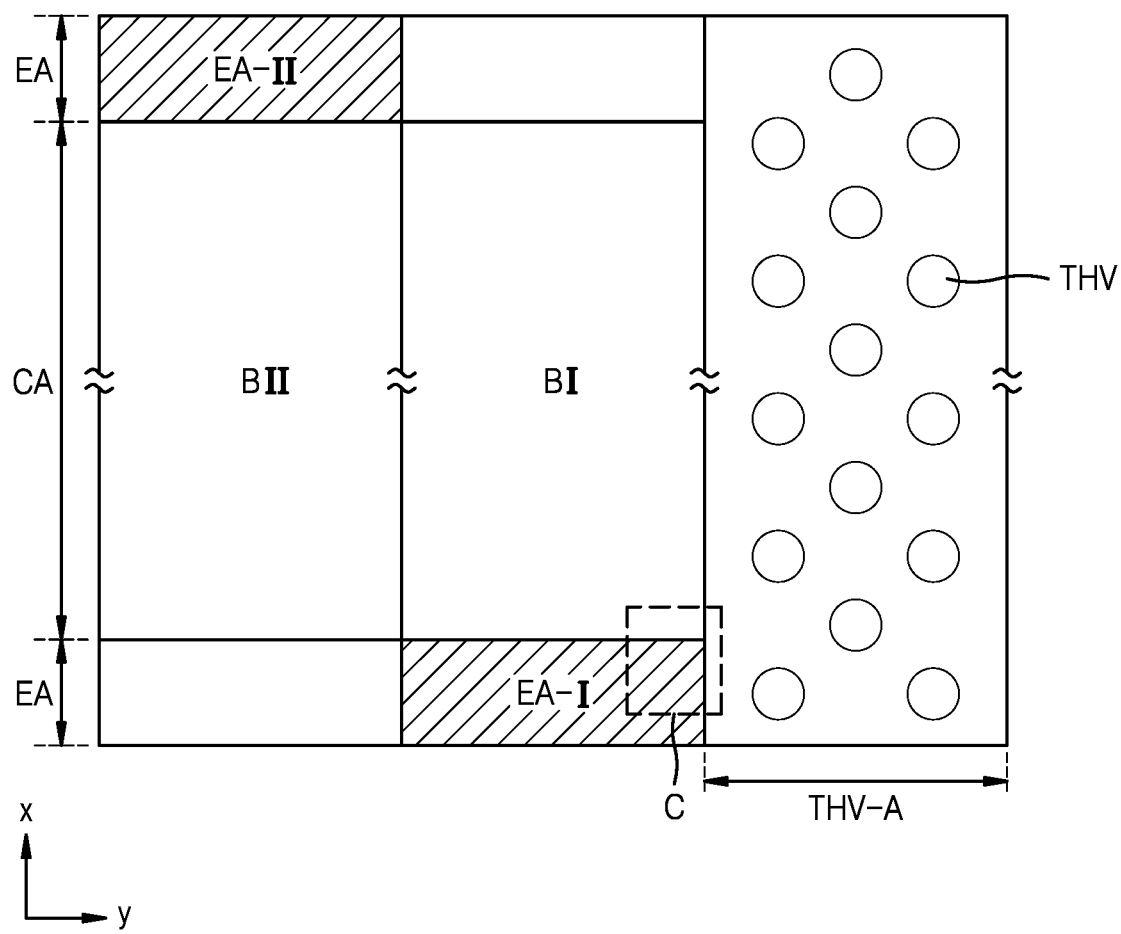
FIG. 8 is a magnified top view of a portion of the cell area of the three-dimensional nonvolatile memory device of FIG. 2.
Figure 9B:
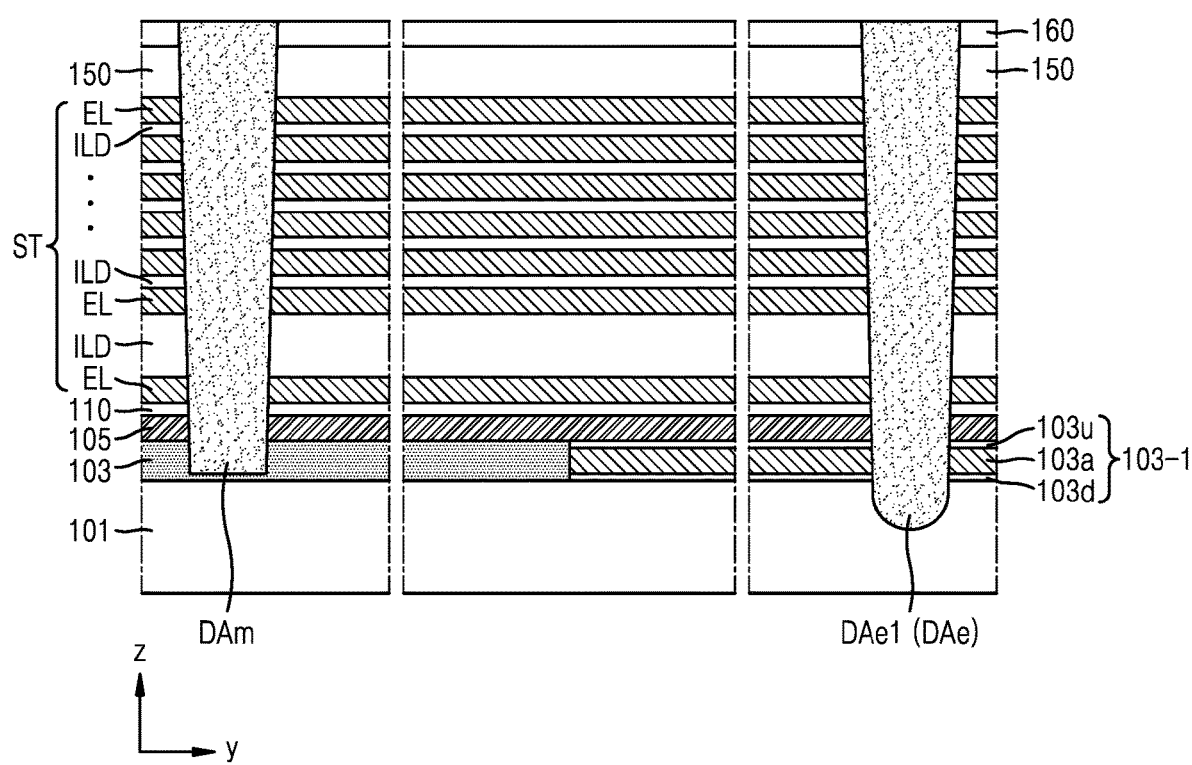
FIG. 9B is a cross-sectional view of the three-dimensional nonvolatile memory device taken along line III-III' of FIG. 9A.
Figure 9C:
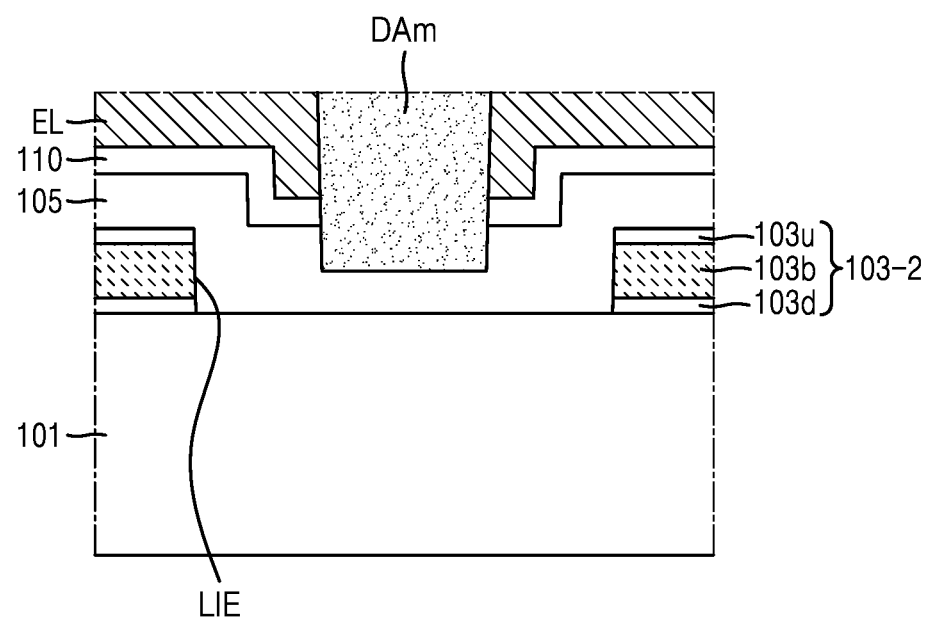
FIG. 9C is a cross-sectional view of part of a lower portion taken along line IV-IV' of FIG. 9A.
Figure 9D:
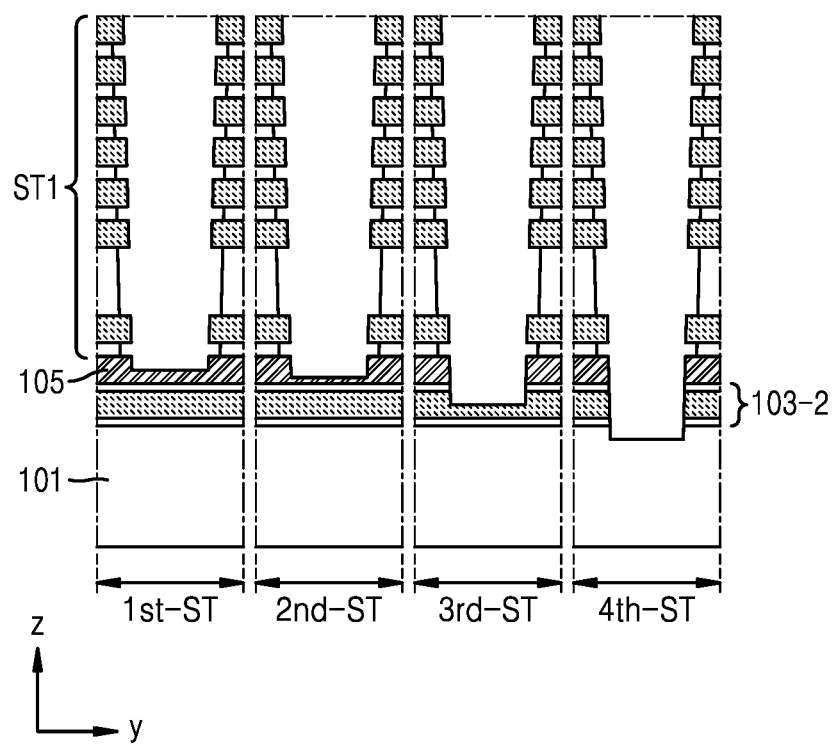
FIG. 9D is a cross-sectional view of a structure of a layer-specific separation trench in an extension area of FIG. 9A.

FIG. 8 is a magnified top view of a portion of the cell area CA of the memory device 100 of FIG. 2, FIG. 9A is a magnified top view of region C of FIG. 8, and FIG. 9B is a cross-sectional view of the memory device 100 taken along line III-III' of FIG. 9A. In addition, FIG. 9C is a cross-sectional view of a part of a lower portion taken along line IV-IV' of FIG. 9A, and FIG. 9D is a cross-sectional view of a structure of a layer-specific separation trench in an extension area EA of FIG. 9A.

Referring to FIG. 8, in the memory device 100 of the present embodiment, cells of a block unit may be arranged in the cell area CA in the second direction (y direction). In addition, extension areas EA may be arranged at both sides of the cell area CA in the first direction (x direction). The cell area CA of one block may use, as an electrode pad, an extension area EA at any one side in the first direction (x direction). For example, the cell area CA of a first block BI at the right may use, as an electrode pad, a first extension area EA-I located at a lower side in the first direction (x direction), and the cell area CA of a second block BII at the left may use, as an electrode pad, a second extension area EA-II located at an upper side in the first direction (x direction).

Referring to FIGS. 9A to 9D, vertical structures VCS may be arranged in the cell area CA. In addition, vertical structures VCSd may also be arranged in an extension area EA. As described above, the vertical structures VCSd in the extension area EA may be dummy structures. The vertical structures VCSd in the extension area EA may be arranged in a shape of encompassing a vertical contact VC connected to an electrode pad in the extension area EA.

Herein, a dashed line LIE is a lower part of a stacking structure ST and may indicate a boundary between an area having the at least one insulating layer 103-2 and an are without the at least one insulating layer 103-2. For example, as shown in FIG. 9C, the at least one insulating layer 103-2 does not exist at a lower part of the main separation insulating layer DAm, and accordingly, the support layer 105 may be formed directly on the substrate 101. In addition, as shown through the dashed line LIE, the at least one insulating layer 103-2 may not exist at a boundary part between the cell area CA and the extension area EA.

A separation insulating layer DA may extend from the cell area CA to the extension area EA in the first direction (x direction). When a through-via wiring area THV-A is arranged at the right side of the first block BI, at least a portion of the cell area CA in the first block BI may correspond to a first edge cell area CAe1. In addition, the separation insulating layer DA in the first edge cell area CAe1 may correspond to a first edge separation insulating layer DAe1. For example, in FIG. 9A, a separation insulating layer DA at the right side may correspond to a first edge separation insulating layer DAe1, and a separation insulating layer DA at the left side may correspond to a main separation insulating layer DAm.

Accordingly, as shown in FIG. 9B, the main separation insulating layer DAm at the left side and the first horizontal layer 103 in contact with the main separation insulating layer DAm at the left side may have substantially the same structure as the main separation insulating layer DAm and the first horizontal layer 103 in the main cell area CAm of FIG. 4. However, here the main separation insulating layer Dam may not contact the substrate 101. In addition, the first edge separation insulating layer DAe1 at the right side and the at least one material layer 103-1 in contact with the first edge separation insulating layer DAe1 at the right side may have substantially the same structure as the first edge separation insulating layer DAe1 and the at least one material layer 103-1 in the first edge cell area CAe1 of FIG. 4. The first horizontal layer 103 and the at least one material layer 103-1 may be in contact with each other at an intermediate part in the second direction (y direction). According to an exemplary embodiment of the inventive concept, when the main separation insulating layer DAm is somewhat close to the first edge cell area CAe1 in the second direction (y direction), only the first horizontal layer 103 first formed through a substitution process may exist, and the at least one material layer 103-1 may not exist.

As described above, a staircase structure part of the extension area EA may be covered by the flat insulating layer 150 such as an oxide film, and a thickness of the flat insulating layer 150 may be thicker as the flat insulating layer 150 gets farther from the cell area CA in the first direction (x direction). In general, in a process of forming a separation trench, an oxide film part may be more easily etched than apart of the mold structure ST1. Accordingly, as shown in FIG. 9D, a depth of a trench may be greater moving farther from the cell area CA in the first direction (x direction). In FIG. 9D, 1st-ST to 4th-ST may denote first to fourth staircase parts from the cell area CA. However, a depth of a trench does not have to be continuously greater, and for example, when a trench is far by a certain distance from the cell area CA, depths of trenches may be substantially the same.

FIG. 10 is a cross-sectional view of the memory device 100 according to an exemplary embodiment of the inventive concept.

Referring to FIG. 10, in the memory device 100 of the present embodiment, a cell area CA and an extension area EA may be arranged on the substrate 101, and a peripheral circuit area PCA may be arranged under the substrate 101. A structure or memory device having the cell area CA on the peripheral circuit area PCA may be referred to as a cell on peri (COP) structure or memory device.

A part of the cell area CA is the same as described with respect to the cell areas CAm and CAe1 of FIG. 4. However, the cell areas CAm and CAe1 of FIG. 4 may correspond to a cross-section orthogonal to the first direction (x direction), whereas the part of the cell area CA of FIG. 10 may correspond to a cross-section orthogonal to the second direction (y direction).

A part of the extension area EA is the same as described with respect to the extension area EA of FIG. 9A. However, the extension area EA of FIG. 9A corresponds to a top view, whereas the part of the extension area EA of FIG. 10 may correspond to a cross-section orthogonal to the second direction (y direction). As shown in FIG. 10, an electrode layer EL extends in the first direction (x direction) and has a staircase structure in the extension area EA, and an exposed part may correspond to an electrode pad of the electrode layer EL. Vertical contacts VC may be connected to such electrode pads. The vertical contacts VC may be connected to interconnection lines ICL thereon through contact plugs CP, respectively. Although electrode pads are exposed in a one-layer unit in FIG. 10, electrode pads may be exposed in a two-layer unit according to exemplary embodiments of the inventive concept. In a structure of exposing electrode pads in a two-layer unit, the extension area EA may be divided into two partial extension areas, wherein odd-layer electrode pads are exposed in one partial extension area, and even-layer electrode pads are exposed in the other partial extension area.

The peripheral circuit area PCA may be under the substrate 101. In other words, the cell area CA may be stacked on the peripheral circuit area PCA. Therefore, the cell area CA may be overlaid on the peripheral circuit area PCA. The peripheral circuit area PCA may be formed on a base substrate 201. The base substrate 201 may be the same as that described with respect to the substrate 101 of FIG. 4. In the memory device 100 of the present embodiment, the base substrate 201 may be formed based on a monocrystalline silicon wafer. The base substrate 201 may have an n-well area doped with n-type impurities and a p-well area doped with p-type impurities, and active areas may be defined in the n-well area and the p-well area by a device separation layer.

In the peripheral circuit area PCA, high voltage and/or low voltage transistors and passive devices such as a resistor and a capacitor may be arranged. For example, the peripheral circuit area PCA may include a peripheral circuit transistor PTR including a peripheral circuit gate electrode PG and a source/drain area S/D. In addition, the peripheral circuit area PCA may include peripheral circuit lines LM0, LM1, and LM2 connected to the peripheral circuit gate electrode PG and the source/drain area S/D. In FIG. 10, although the peripheral circuit lines LM0, LM1, and LM2 are formed in a three-layer structure, a layered structure of the peripheral circuit lines LM0, LM1, and LM2 is not limited thereto. The peripheral circuit transistor PTR may be connected to the peripheral circuit line LM0, and the peripheral circuit lines LM0, LM1, and LM2 may be connected to each other through vertical contacts VC0, VC1, and VC2.

A base interlayer insulating layer 220 may be on the base substrate 201 to cover the peripheral circuit lines LM0, LM1, and LM2 and the vertical contacts VC0, VC1, and VC2. Although the base interlayer insulating layer 220 is shown in FIG. 10 as a single-layer structure, the base interlayer insulating layer 220 may have a multi-layer structure according to a layered structure of the peripheral circuit lines LM0, LM1, and LM2.

A through-via wiring area THV-A may be in the cell area CA or the extension area EA. As described above, through-vias THV may be formed in the through-via wiring area THV-A. Lines in the cell area CA may be connected to lines in the peripheral circuit area PCA through the through-vias THV. A medium insulation layer 250 may be between the substrate 101 and the peripheral circuit area PCA. The medium insulation layer 250 may be formed of, for example, an oxide film. However, a material of the medium insulation layer 250 is not limited to the oxide film.

In addition, the substrate 101 may be formed of polysilicon. For example, a trench area for a substrate may be formed on the medium insulation layer 250, and the substrate 101 may be formed by filling the trench area with polysilicon. As such, when the substrate 101 is formed of polysilicon, the peripheral circuit area PCA may be formed on the base substrate 201, and the substrate 101 may be formed on the medium insulation layer 250. Thereafter, the cell area CA and the extension area EA may be formed on the substrate 101, and the through-vias THV may be formed in the through-via wiring area THV-A, thereby implementing a COP structure.

Alternatively, the substrate 101 may be formed by a monocrystalline silicon substrate. When the substrate 101 is formed by a monocrystalline silicon substrate, the peripheral circuit area PCA may be formed on the base substrate 201, and the cell area CA and the extension area EA may be formed on the substrate 101. Thereafter, a chip or wafer including the substrate 101 may be stacked on and bonded to the chip or wafer including the base substrate 201, and then, the through-vias THV may be formed in the through-via wiring area THV-A, thereby implementing a COP structure.

FIGS. 1A to 16B are cross-sectional views of a method of fabricating a three-dimensional nonvolatile memory device, according to an exemplary embodiment of the inventive concept, wherein drawings numbered A (e.g., 11A) are cross-sectional views of a main cell area CAm, and drawings numbered B (e.g., 11B) are cross-sectional views of a first edge cell area CAe1. FIGS. 11A to 16B will be described with reference to FIGS. 4 and 7 together, and the description made with reference to FIGS. 4 and 7 will be simply repeated or omitted.

Figure 11A:
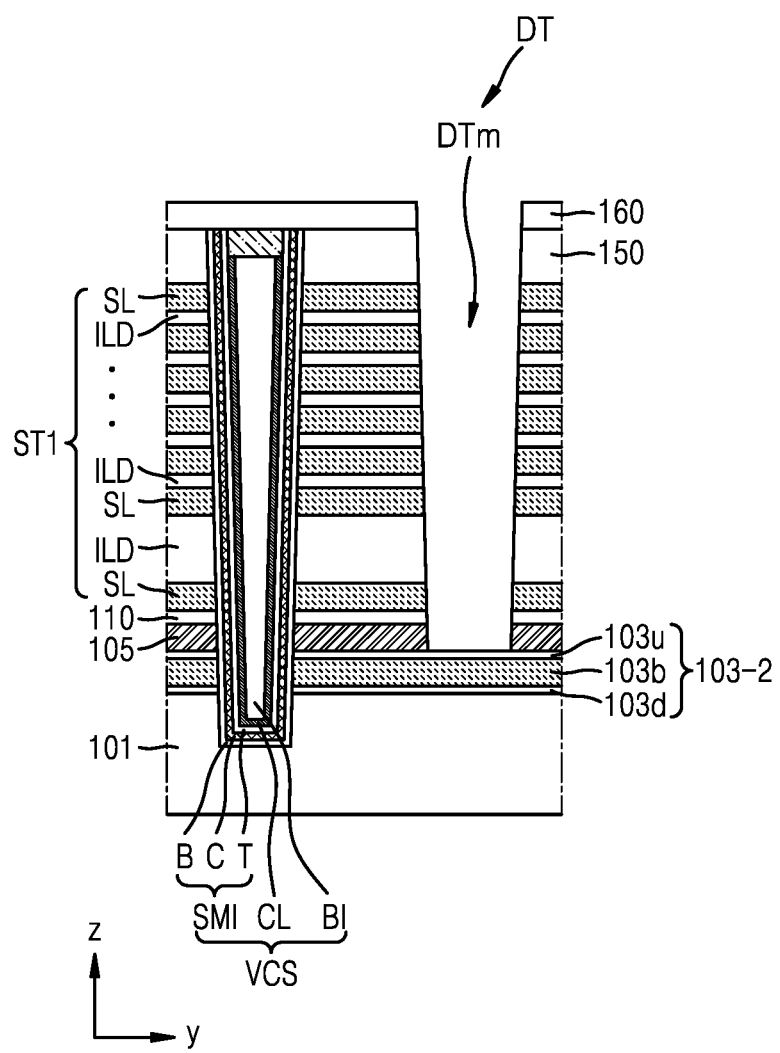
FIGS. 11A, 11B, 12A, 12B, 13A, 13B, 14A, 14B, 15A, 15B, 16A and 16B are cross-sectional views of a method of fabricating a three-dimensional nonvolatile memory device, according to an exemplary embodiment of the inventive concept.
Figure 11B:
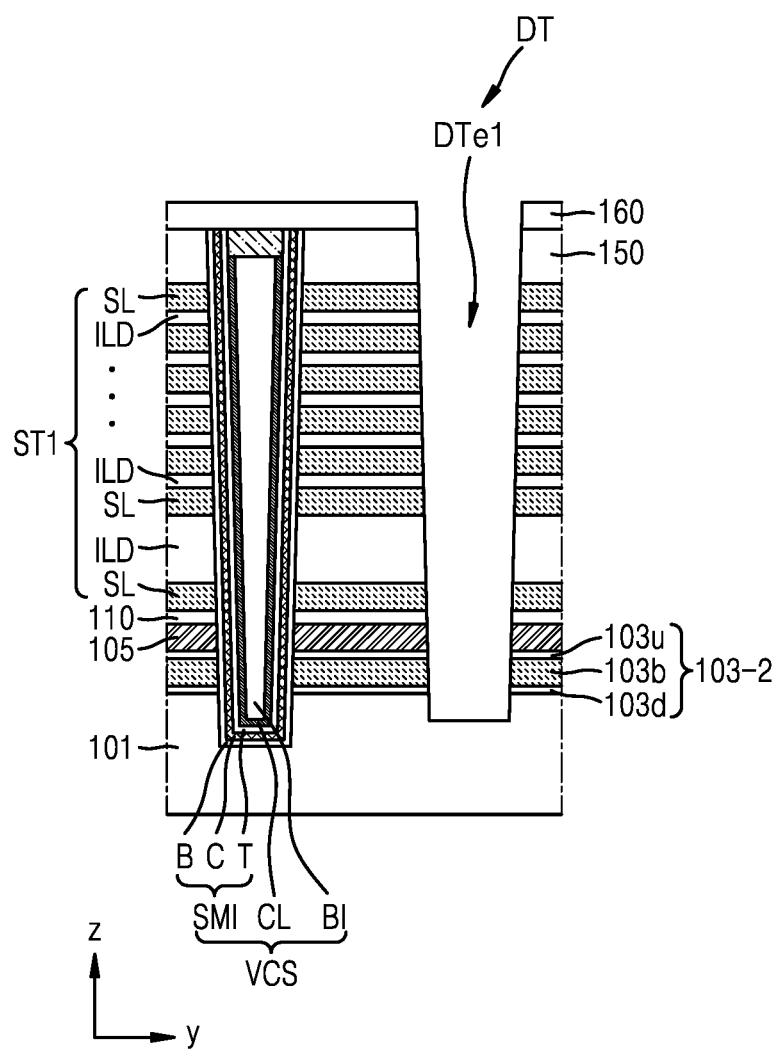

Referring to FIGS. 11A and 11B, the at least one insulating layer 103-2 and the support layer 105 are formed on the substrate 101. The at least one insulating layer 103-2 may include the horizontal insulating layer 103b and the thin-film insulating layers 103u and 103d respectively on upper and lower surfaces of the horizontal insulating layer 103b. For example, the horizontal insulating layer 103b may be formed of a silicon nitride film, and the thin-film insulating layers 103u and 103d may be formed of a silicon oxide film. In addition, the support layer 105 may be formed of polysilicon. However, materials of the at least one insulating layer 103-2 and the support layer 105 are not limited thereto.

The mold structure ST1 is formed on the support layer 105. The mold structure ST1 may include sacrificial layers SL and interlayer insulating layers ILD vertically and alternately stacked. In the mold structure ST1, the sacrificial layers SL may be formed of a material having an etching selectivity for the interlayer insulating layers ILD. For example, the sacrificial layers SL may be formed of a silicon nitride film, and the interlayer insulating layers ILD may be formed of a silicon oxide film. However, materials of the sacrificial layers SL and the interlayer insulating layers ILD are not limited thereto.

Through a trimming process, the mold structure ST1 of a staircase structure is formed in the extension area EA and the mat outlying area MOA. Thereafter, a material layer covering the mold structure ST1 is deposited on the whole surface of the substrate 101 and is flattened to form the flat insulating layer 150. The flat insulating layer 150 may cover the mold structure ST1 in the cell area CA and the mold structure ST of a staircase structure in the extension area EA and the mat outlying area MOA.

In the cell area CA and the extension area EA, vertical holes passing through the mold structure ST1 are formed. The vertical holes may be formed in a form in which an upper part of the substrate 101 is recessed by passing through the mold structure ST1, the support layer 105, and the at least one insulating layer 103-2. The side wall multi-insulating layer SMI, the channel layer CL, and the buried insulating layer BI are formed in the vertical holes to form vertical structures VCS and VCSd.

The first upper interlayer insulating layer 160 covering the upper surfaces of the vertical structures VCS and VCSd and the flat insulating layer 150 is formed on the whole surface of the substrate 101. Thereafter, the first upper interlayer insulating layer 160, the flat insulating layer 150, and the mold structure ST1 are etched to form a separation trench DT extending in the first direction (x direction). The sacrificial layers SL and the interlayer insulating layers ILD of the mold structure ST1 may be exposed to a side wall of the separation trench DT. The separation trench DT may include a main separation trench DTm in the main cell area CAm and a first edge separation trench DTe1 in the first edge cell area CAe1. The first edge separation trench DTe1 may be deeper than the main separation trench DTm.

As shown in FIGS. 11A and 11B, the main separation trench DTm may be formed to expose the at least one insulating layer 103-2 by passing through the mold structure ST1 and the support layer 105. The first edge separation trench DTe1 may be formed in a form in which an upper part of the substrate 101 is recessed by passing through the mold structure ST1, the support layer 105, and the at least one insulating layer 103-2.

Figure 12A:
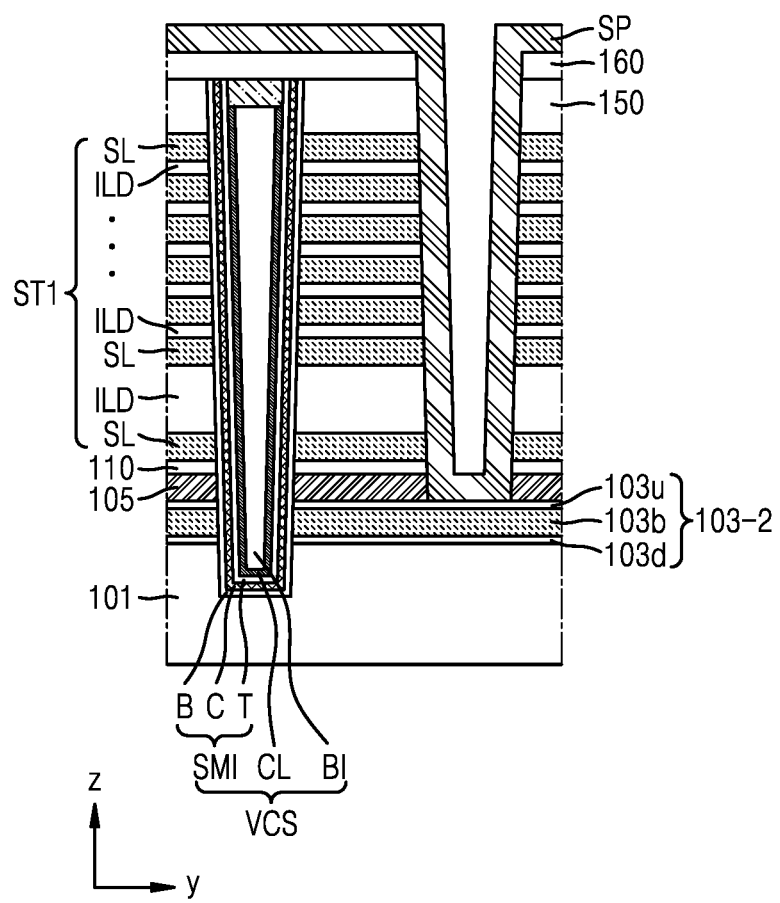
Figure 12B:
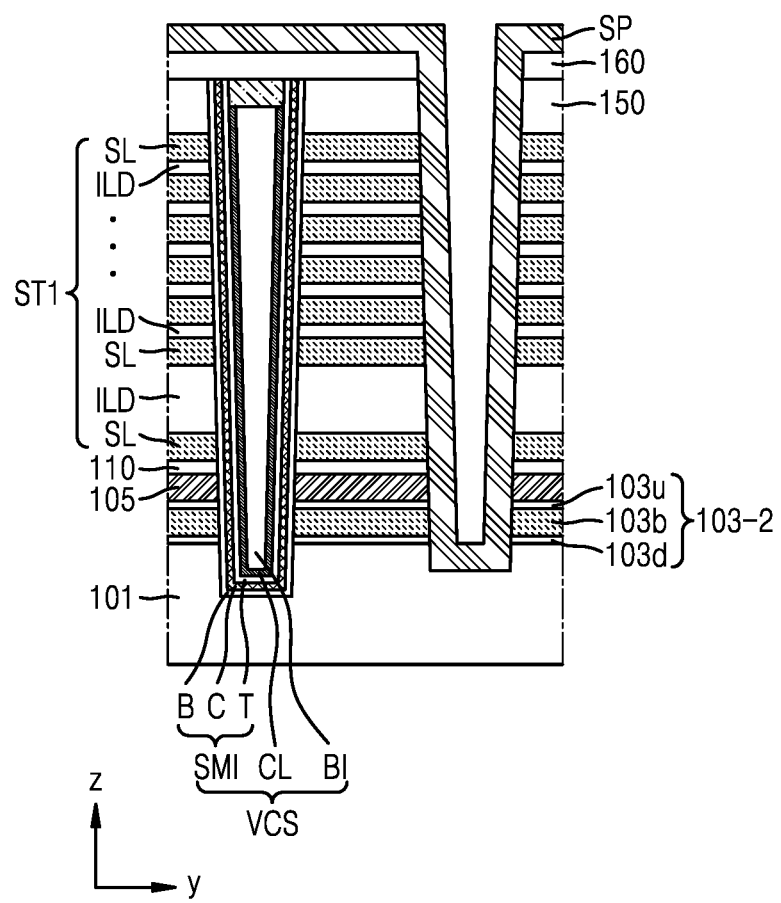

Referring to FIGS. 12A and 12B, a spacer material layer SP is formed on the whole surface of the substrate 101. The spacer material layer SP may cover the inside of the separation trench DT, e.g., a bottom surface and a side wall of the separation trench DT. In addition, the spacer material layer SP may cover an upper surface of the first upper interlayer insulating layer 160. The spacer material layer SP may be formed of polysilicon. However, a material of the spacer material layer SP is not limited thereto.

Figure 13A:
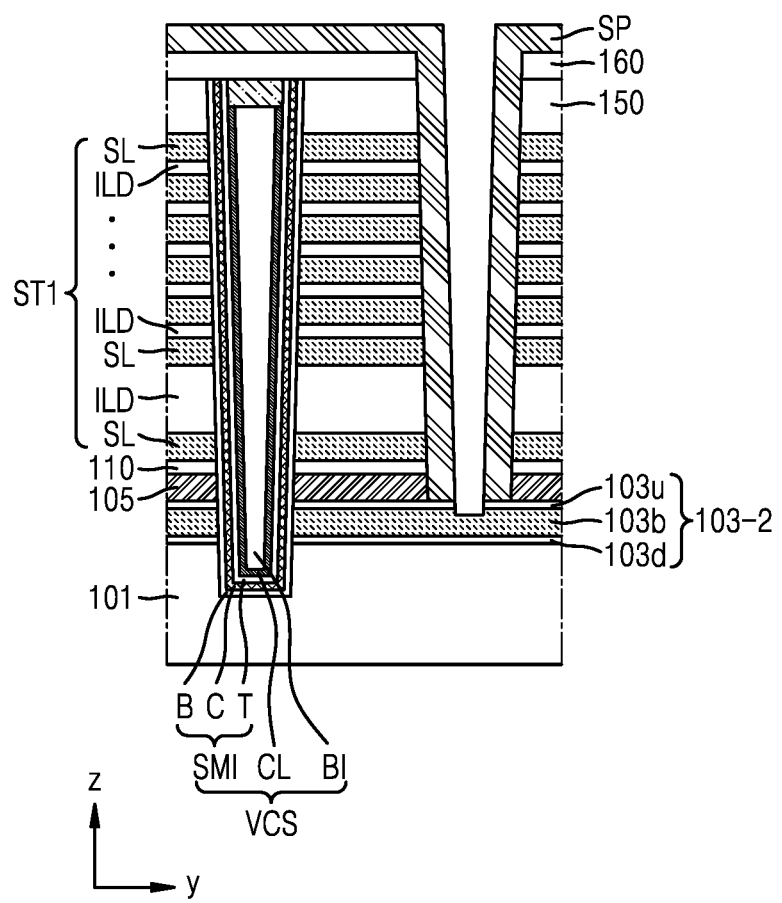
Figure 13B:
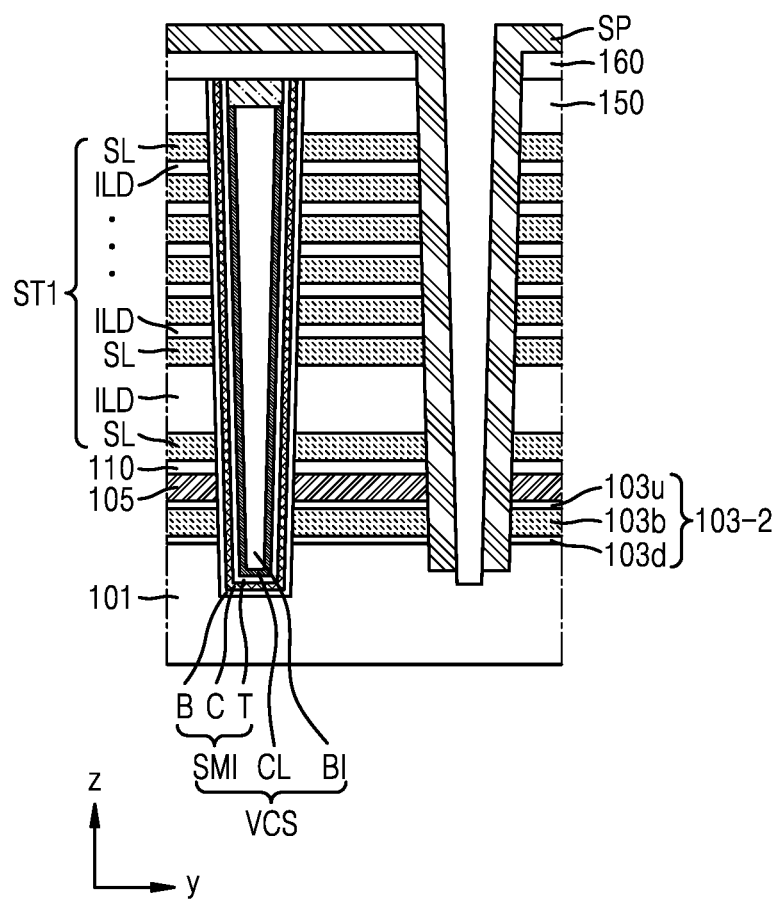

Referring to FIGS. 13A and 13B, a lower surface of the spacer material layer SP is etched to expose corresponding material layers through a lower surface of the separation trench DT. Upper parts of the material layers exposed by the etching of the lower surface of the spacer material layer SP may be recessed. Particularly, in the main separation trench DTm, the at least one insulating layer 103-2 is exposed through a lower surface of the main separation trench DTm by the etching of the lower surface of the spacer material layer SP, and an upper part of the at least one insulating layer 103-2. In this case, e.g., an upper part of the horizontal insulating layer 103b, may be recessed by removing the overlying thin-film insulating layer 103u. In the first edge separation trench DTe1, the substrate 101 is exposed through a lower surface of the first edge separation trench DTe1 by the etching of the lower surface of the spacer material layer SP, and an upper part of the substrate 101 may be further recessed.

The etching of the lower surface of the spacer material layer SP may be performed through, for example, an etch-back process. In general, the etch-back process etches the whole spacer material layer SP at a uniform thickness, but in a memory device fabricating process of the present embodiment, a thin protective film may be formed on the spacer material layer SP on the upper surface of the first upper interlayer insulating layer 160 and an entrance of the separation trench DT before the etch-back process, and then, the etch-back process may be performed, thereby etching only a lower surface part of the spacer material layer SP. Herein the protective film may be a material layer containing, for example, carbon (C).

Figure 14A:
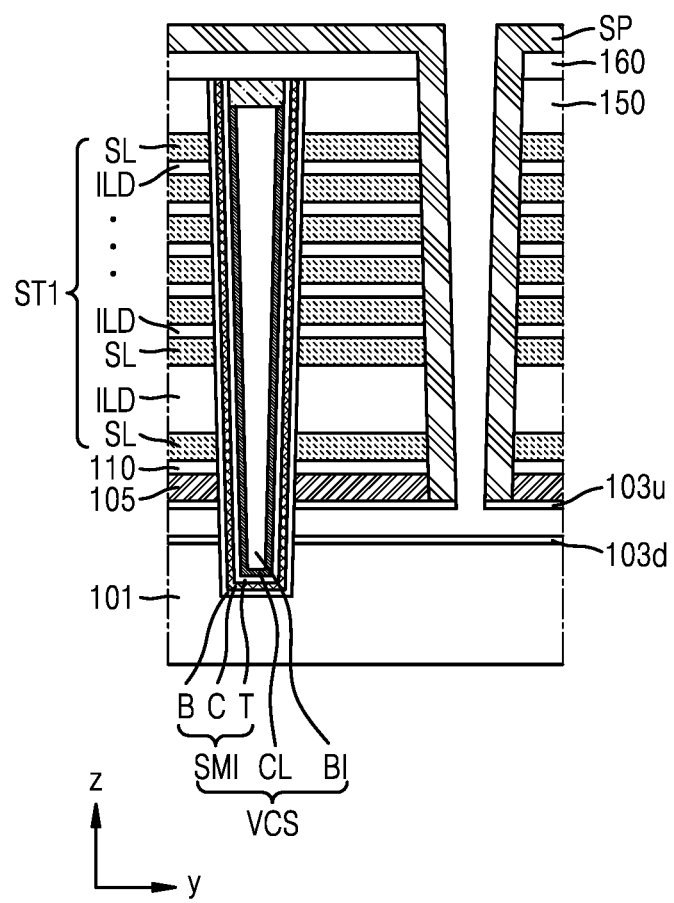
Figure 14B:
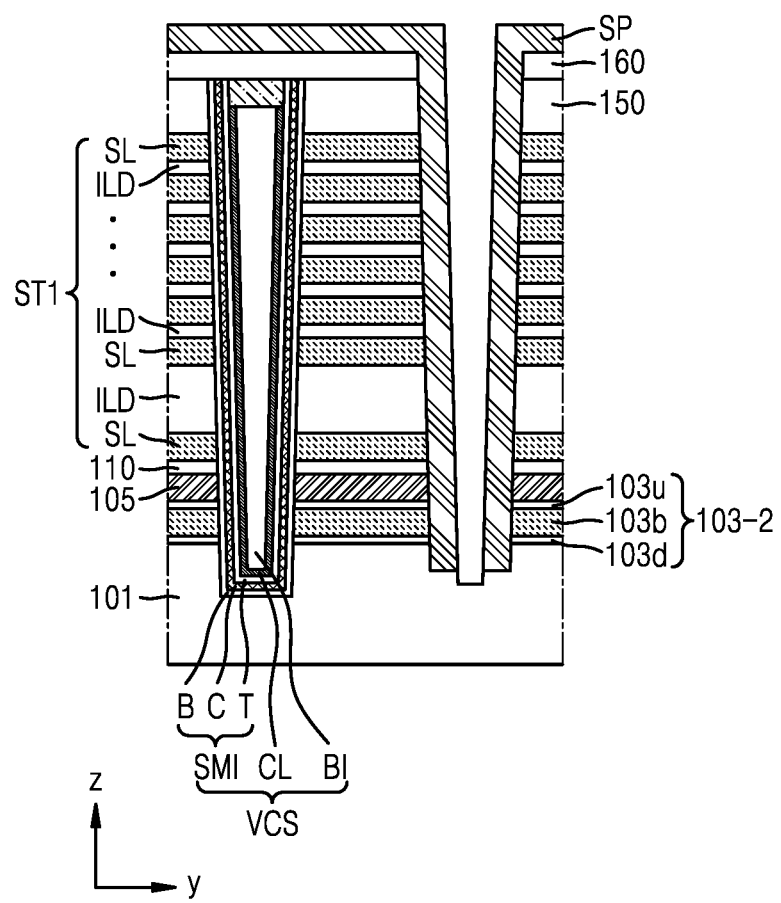

Referring to FIGS. 14A and 14B, the horizontal insulating layer 103b and the sacrificial layer SL exposed by the etching of the lower surface of the spacer material layer SP are removed. Particularly, in the main separation trench DTm, the horizontal insulating layer 103b is removed. In this case, an empty space is formed between the thin-film insulating layers 103u and 103d. The horizontal insulating layer 103b and the sacrificial layer SL are formed of a silicon nitride film and thus may be removed through a pull-back process by using an etchant including phosphoric acid. In the first edge separation trench DTe1, only the substrate 101 of polysilicon is exposed. In this case, the horizontal insulating layer 103b and the sacrificial layer SL are covered by the spacer material layer SP, and thus the horizontal insulating layer 103b and the sacrificial layer SL may not be etched.

In a process of removing the horizontal insulating layer 103b and the sacrificial layer SL, the thin-film insulating layers 103u and 103d on the upper and lower surfaces of the horizontal insulating layer 103b may also be removed through dry etching. In addition, in a process of removing the thin-film insulating layers 103u and 103d, the side wall multi-insulating layer SMI of the vertical structure VCS may also be removed, thereby exposing the channel layer CL of the vertical structure VCS. FIGS. 14A and 14B show a state before the thin-film insulating layers 103u and 103d are etched, and accordingly, show a state in which the side wall multi-insulating layer SMI of the vertical structure VCS is maintained.

Figure 15A:
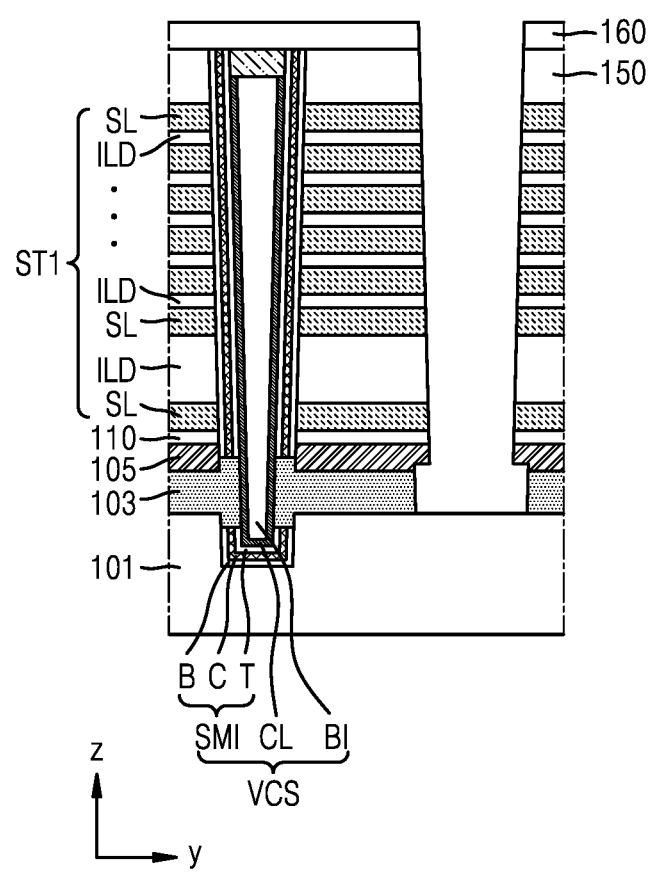
Figure 15B:
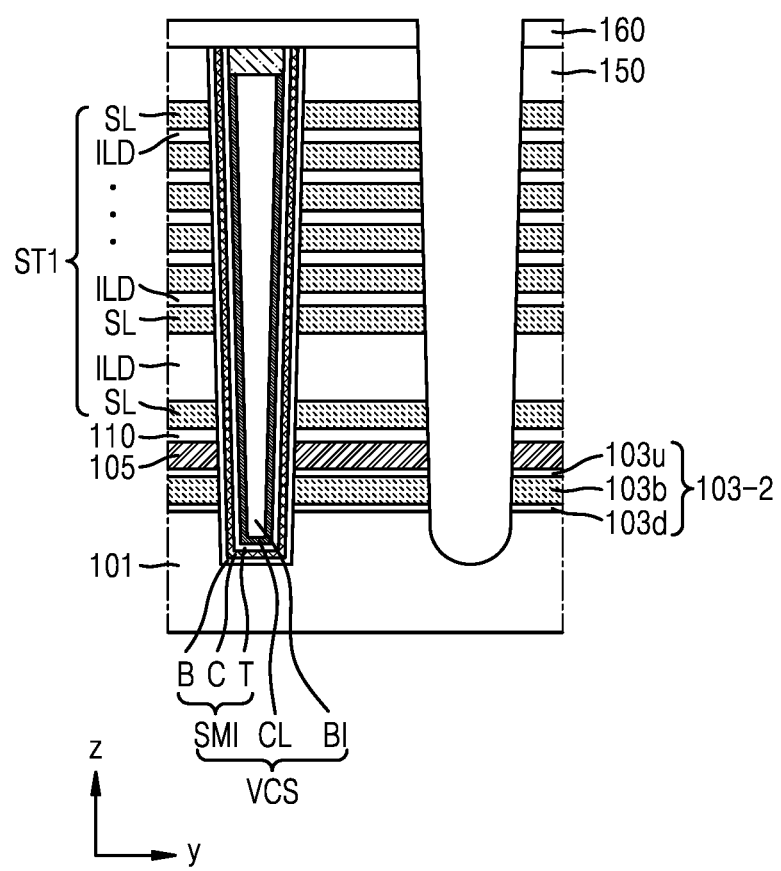

Referring to FIGS. 15A and 15B, a conductive layer is substituted for a part where the horizontal insulating layer 103b and the sacrificial layer SL are removed. Particularly, in the main separation trench DTm, a conductive layer, e.g., polysilicon, may be substituted for the horizontal insulating layer 103b. For example, the conductive layer may be provided in the space between the thin-film insulating layers 103u and 103d. As shown in FIGS. 15A and 15B, in a substitution process of the conductive layer, the conductive layer may be filled from an inner side in the horizontal direction, thereby having a structure in which a lower part of the separation trench DT is concave to the inner side. This is because a process is performed by repeating etching and deposition to form a voidless conductive layer in the substitution process of the conductive layer. When such a process is continuously performed, the conductive layer may be filled up to a portion of a lower part of the separation trench DT.

Through the substitution process of the conductive layer, in the main cell area CAm having the main separation trench DTm, the first horizontal layer 103 in contact with the channel layer CL of the vertical structure VCS may be formed. As described above, the first horizontal layer 103 may form the common source line CSL.

After forming the first horizontal layer 103, the spacer material layer SP is removed. Through the removal of the spacer material layer SP, the sacrificial layers SL and the interlayer insulating layers ILD of the mold structure ST1 may be exposed again to the side wall of the separation trench DT. At the lowest part of the first edge separation trench DTe1, the at least one insulating layer 103-2 may be exposed to a side wall of the first edge separation trench DTe1.

Figure 16A:
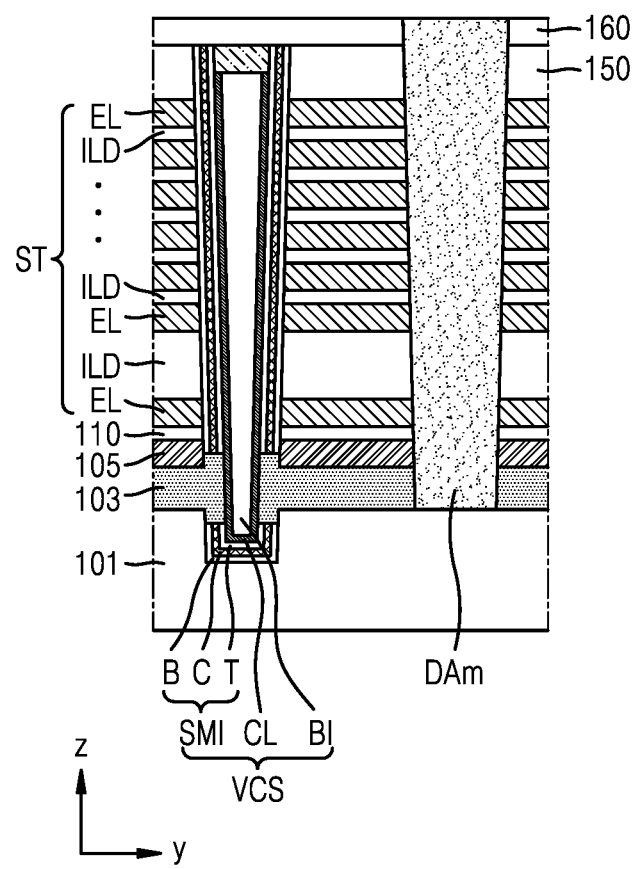
Figure 16B:
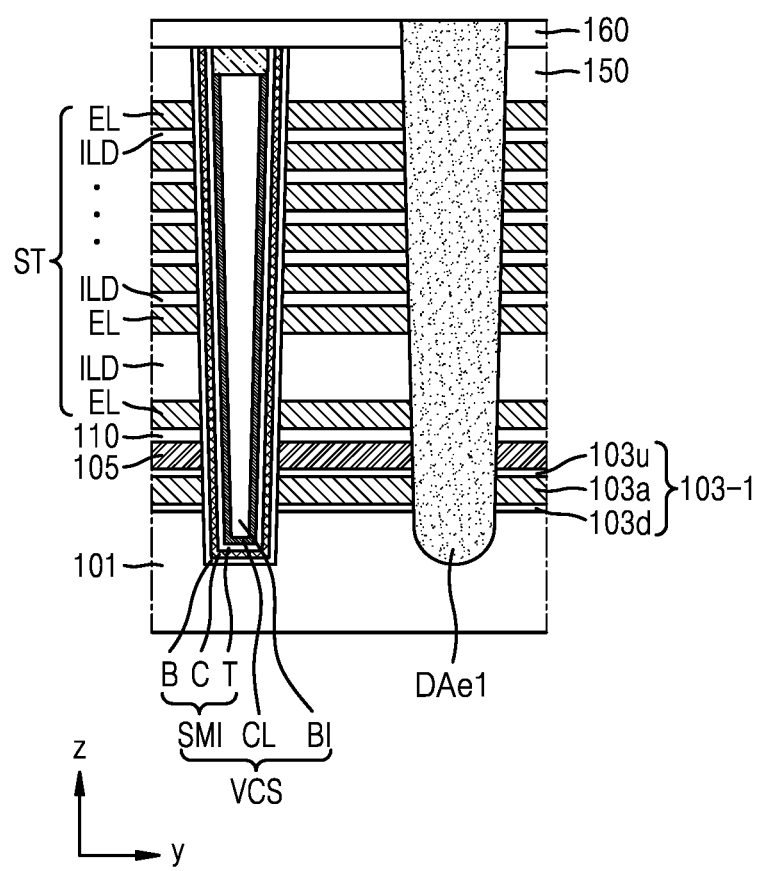

Referring to FIGS. 16A and 16B, electrode layers EL may be formed by substituting a conductive material, e.g., W, for the sacrificial layers SL of the mold structure ST. By forming the electrode layers EL through a substitution process, a stacking structure ST in which the electrode layers EL and the interlayer insulating layers ILD are alternately stacked may be formed. In the first edge separation trench DTe1, the at least one material layer 103-1 may be formed by substituting W for the horizontal insulating layer 103b of the at least one insulating layer 103-2. The at least one material layer 103-1 may include, for example, the second horizontal layer 103a and the thin-film insulating layers 103u and 103d respectively on the upper and lower surfaces of the second horizontal layer 103a. In addition, the at least one material layer 103-1 may be in contact with the side wall multi-insulating layer SMI of the vertical structure VCS. The first edge cell area CAe1 having the first edge separation trench DTe1 is not an area in which normal cells are arranged, and thus, the second horizontal layer 103a does not have to perform an electrical function.

Thereafter, a separation insulating layer DA may be formed by filling a part of the separation trench DT with an insulating layer. The separation insulating layer DA may include, for example, the main separation insulating layer DAm in the main cell area CAm and the first edge separation insulating layer DAe1 in the first edge cell area CAe1.

Thereafter, a vertical contact VC may be formed in the extension area EA, and contact plugs CP, sub-bit lines SBL, bit line contact plugs BCP, bit lines BL, and interconnection lines ICL may be formed in the cell area CA and the extension area EA. In addition, through-vias THV may be formed in a through-via wiring area THV-A.

While the inventive concept has been particularly shown and described with reference to exemplary embodiments thereof, it will be understood that various changes in form and details may be made thereto without departing from the spirit and scope of the inventive concept as set forth in the following claims.

What is claimed is:

1. A three-dimensional nonvolatile memory device, comprising:
a first substrate including a cell area and an extension area arranged at a side of the cell area in a first direction, wherein the extension area has a staircase structure;
a vertical structure extending in a vertical direction from an upper surface of the first substrate;
a stacking structure having electrode layers and interlayer insulating layers alternately stacked on the first substrate along a side wall of the vertical structure;
a separation insulating layer extending on the first substrate in the first direction and separating the electrode layers in a second direction that intersects the first direction; and
a through-via wiring area adjacent to the cell area or the extension area and having through-vias passing through the first substrate,
wherein the cell area comprises a main cell area in which normal cells are arranged and an edge cell area at a peripheral part of the cell area,
the separation insulating layer comprises a main separation insulating layer in the main cell area and an edge separation insulating layer in the edge cell area, and
a lower surface of the main separation insulating layer is higher than the upper surface of the first substrate and has a different depth from that of a lower surface of the edge separation insulating layer.

2. The three-dimensional nonvolatile memory device of claim 1, further comprising a support layer arranged under the stacking structure on the first substrate and extending in parallel to the upper surface of the first substrate,
wherein the vertical structure comprises a channel layer extending in the vertical direction and a side wall multi-insulating layer on the channel layer,
in the main cell area, there is arranged a first horizontal layer under the support layer, extending in parallel to the upper surface of the first substrate, passing through the side wall multi-insulating layer, and in contact with the channel layer, and
in the edge cell area, there is arranged at least one material layer under the support layer and extending in parallel to the upper surface of the first substrate, and the at least one material layer comprises any one of the first horizontal layer passing through the side wall multi-insulating layer and contacting the channel layer, a first insulating layer in contact with the side wall multi-insulating layer, and a second insulating layer in contact with the side wall multi-insulating layer.

3. The three-dimensional nonvolatile memory device of claim 1, further comprising a support layer arranged under the stacking structure on the first substrate and extending in parallel to the upper surface of the first substrate,
wherein the edge cell area comprises a first edge cell area adjacent to the through-via wiring area and a second edge cell area adjacent to an outermost portion of the cell area in the second direction,
the edge separation insulating layer comprises a first edge separation insulating layer in the first edge cell area and a second edge separation insulating layer in the second edge cell area,
at least one material layer under the support layer and extending in parallel to the upper surface of the first substrate is arranged in the edge cell area, a lower surface of the first edge separation insulating layer is lower than the upper surface of the first substrate, and
the at least one material layer comprises a horizontal layer in contact with a side wall multi-insulating layer of the vertical structure and thin-film insulating layers on upper and lower surfaces of the horizontal layer.

4. The three-dimensional nonvolatile memory device of claim 1, further comprising a support layer arranged under the stacking structure on the first substrate and extending in parallel to the upper surface of the first substrate,
wherein at least one material layer under the support layer and extending in parallel to the upper surface of the first substrate is arranged in the edge cell area, and
a lower surface of the edge separation insulating layer is higher than an upper surface of the at least one material layer.

5. The three-dimensional nonvolatile memory device of claim 1, further comprising:
a support layer arranged under the stacking structure on the first substrate and extending in parallel to the upper surface of the first substrate,
wherein the extension area and the edge cell area adjacent to the extension area comprise at least one material layer between the support layer and the first substrate, and
the main separation insulating layer extends to the extension area and has a greater depth in the extension area than in the cell area.

6. The three-dimensional nonvolatile memory device of claim 5, wherein the support layer at a first area corresponding to the main separation insulating layer and a second area corresponding to a boundary between the cell area and the extension area is disposed directly on the first substrate, and is lower than the support layer at a third area adjacent to the first and second areas.

7. The three-dimensional nonvolatile memory device of claim 1, further comprising a support layer arranged under the stacking structure on the first substrate and extending in parallel to the upper surface of the first substrate,
wherein at least one material layer under the support layer and extending in parallel to the upper surface of the first substrate is arranged in the edge cell area,
the through-via wiring area is adjacent to the extension area, and
in the extension area, the main separation insulating layer is lower than the upper surface of the first substrate, and the at least one material layer comprises a first horizontal layer in contact with a side wall multi-insulating layer and thin-film insulating layers on upper and lower surfaces of a second horizontal layer.

8. The three-dimensional nonvolatile memory device of claim 7, wherein the first horizontal layer includes polysilicon, and
the second horizontal layer includes tungsten.

9. The three-dimensional nonvolatile memory device of claim 1, further comprising a support layer arranged under the stacking structure on the first substrate and extending in parallel to the upper surface of the first substrate,
wherein a lower surface of the vertical structure is lower than the upper surface of the first substrate, and
in the main cell area, an upper surface of a horizontal layer in contact with a channel layer of the vertical structure is higher than a lower surface of the support layer, and a lower surface of the horizontal layer is lower than the upper surface of the first substrate.

10. The three-dimensional nonvolatile memory device of claim 1, wherein a critical dimension (CD) of the edge separation insulating layer in the second direction is greater than or substantially the same as a CD of the main separation insulating layer in the second direction.

11. The three-dimensional nonvolatile memory device of claim 1, further comprising a peripheral circuit area on a second substrate,
wherein the peripheral circuit area is under the first substrate, and
lines in the cell area are connected to lines in the peripheral circuit area by the through-vias.

12. The three-dimensional nonvolatile memory device of claim 1, wherein the separation insulating layer comprises an insulating layer filled in a trench extending in the first direction or comprises spacers on both side walls of the trench and a conductive layer between the spacers.

13. A three-dimensional nonvolatile memory device, comprising:
a substrate including a cell area in which cells are arranged and an extension area arranged at a side of the cell area in a first direction, wherein the extension area has a staircase structure in the first direction;
a vertical structure extending in a vertical direction from an upper surface of the substrate;
a stacking structure having electrode layers and interlayer insulating layers alternately stacked on the substrate along a side wall of the vertical structure; and
a separation insulating layer extending on the substrate in the first direction and separating the electrode layers in a second direction that intersects the first direction,
wherein the cell area comprises a main cell area in which normal cells are arranged and an edge cell area at a peripheral part of the cell area,
the separation insulating layer comprises a main separation insulating layer in the main cell area and edge separation insulating layers in the edge cell area, and
at least two edge separation insulating layers of the edge separation insulating layers have different depths.

14. The three-dimensional nonvolatile memory device of claim 13, wherein a through-via wiring area having through-vias passing through the substrate is arranged adjacent to the edge cell area,
a lower surface of the main separation insulating layer is higher than the upper surface of the substrate, and
a lower surface of the edge separation insulating layer adjacent to the through-via wiring area is lower than the upper surface of the substrate.

15. The three-dimensional nonvolatile memory device of claim 13, wherein a lower surface of the main separation insulating layer is higher than the upper surface of the substrate, and
a lower surface of one of the edge separation insulating layers in a second direction is higher than the lower surface of the main separation insulating layer.

16. The three-dimensional nonvolatile memory device of claim 13, further comprising:
a support layer arranged under the stacking structure on the substrate and extending in parallel to the upper surface of the substrate; and
at least one material layer arranged between the support layer and the substrate and extending in parallel to the upper surface of the substrate,
wherein the vertical structure comprises a channel layer extending in the vertical direction and a side wall multi-insulating layer on the channel layer, and
the at least one material layer comprises any one of a first horizontal layer passing through the side wall multi-insulating layer and contacting the channel layer, a horizontal insulating layer in contact with the side wall multi-insulating layer, and a second horizontal layer in contact with the side wall multi-insulating layer.

17. The three-dimensional nonvolatile memory device of claim 16, wherein a through-via wiring area having through-vias passing through the substrate is arranged adjacent to the edge cell area, a lower surface of the edge separation insulating layer adjacent to the through-via wiring area is lower than a lower surface of the at least one material layer, and the at least one material layer in contact with a side surface of the edge separation insulating layer adjacent to the through-via wiring area comprises the second horizontal layer and thin-film insulating layers on upper and lower surfaces of the second horizontal layer.

18. The three-dimensional nonvolatile memory device of claim 16, wherein a lower surface of one of the edge separation insulating layers is higher than an upper surface of the at least one material layer.

* * * * *